(12) United States Patent
Huisman

(10) Patent No.: US 8,749,094 B2
(45) Date of Patent: Jun. 10, 2014

(54) POWER SUPPLY, METHOD, AND COMPUTER PROGRAM PRODUCT FOR SUPPLYING ELECTRICAL POWER TO A LOAD

(75) Inventor: Hendrik Huisman, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 209 days.

(21) Appl. No.: 13/256,734

(22) PCT Filed: Mar. 22, 2010

(86) PCT No.: PCT/IB2010/051223
§ 371 (c)(1),
(2), (4) Date: Sep. 15, 2011

(87) PCT Pub. No.: WO2010/109399
PCT Pub. Date: Sep. 30, 2010

(65) Prior Publication Data
US 2012/0007571 A1    Jan. 12, 2012

(30) Foreign Application Priority Data
Mar. 27, 2009  (EP) ..................................... 09156384

(51) Int. Cl.
*H02J 1/12* (2006.01)

(52) U.S. Cl.
USPC ................................. 307/49; 307/82; 363/65

(58) Field of Classification Search
USPC ............ 307/44–46, 48, 49, 82; 323/207, 242, 323/266, 270, 271, 274, 275, 288; 363/17, 363/65, 67, 68, 71, 72, 84, 89, 97, 98
See application file for complete search history.

(56) References Cited

U.S. PATENT DOCUMENTS 3,581,212 A * 5/1971 McMurray ..................... 327/105
5,311,136 A   5/1994 Takahashi (Continued)

FOREIGN PATENT DOCUMENTS

| DE | 19812069 B4 | 9/2011 |
| JP | 1999243689 A | 9/1999 |

(Continued)

OTHER PUBLICATIONS

Lenza, P., et al.; Cascaded Multilevel Inverter with Regeneration Capability and Reduced Number of Switches; 2008; IEEE Trans. on Industrial Electronics; 55(3)1059-1066.

(Continued)

*Primary Examiner* — Adolf Berhane
*Assistant Examiner* — Gary Nash

(57) ABSTRACT

A power supply adapted for supplying electrical power to a load (108), the power supply comprising: at least one powered full bridge circuit (100), wherein the powered full bridge circuit is adapted for being powered by a direct current voltage supply (106), wherein the full bridge circuit (100) comprises a first output connection (104a), and a first switching means (102a-102d) for controlling the application of electrical power to the output connection, at least one floating full bridge circuit (110), wherein each floating full bridge circuit comprises a capacitor (116) adapted for powering the floating full bridge circuit (110), wherein each floating full bridge circuit comprises a second output connection (114b), a second switching means (112a-112d) for controlling the application of electrical power to the output connection, a stack of bridge circuits (100, 110) comprising the at least one powered full bridge circuit and the at least one floating full bridge circuit, wherein the second output convection (114b) and first output connection (104a) are connected in series, wherein the stack has a third output connection (114a), a passive filter (120) for averaging the voltage across the third output connection (114a) and connected to the third output connection, a load connector (122a) adapted for connecting the passive filter (120) to the load (108), a modulator (124) adapted for modulating the first switching means and the second switching means such that the charging or discharging of the capacitor (116) is controlled while electrical power is being supplied to or extracted from the load (108).

14 Claims, 13 Drawing Sheets

(56) References Cited

U.S. PATENT DOCUMENTS

| | | | |
|---|---|---|---|
| 6,031,746 A * | 2/2000 | Steigerwald et al. | 363/71 |
| 6,118,337 A * | 9/2000 | Schweighofer | 330/10 |
| 6,154,031 A | 11/2000 | Hughes | |
| 6,172,558 B1 | 1/2001 | Nowak et al. | |
| 6,605,879 B2 * | 8/2003 | Wade et al. | 307/66 |
| 6,646,439 B1 * | 11/2003 | Bunk | 324/322 |
| 7,116,166 B2 * | 10/2006 | Sabate et al. | 330/146 |
| 7,253,625 B2 | 8/2007 | Trabbic et al. | |
| 2003/0155813 A1 * | 8/2003 | Walter | 307/31 |
| 2005/0275404 A1 | 12/2005 | Sabate et al. | |
| 2006/0114623 A1 | 6/2006 | Domoto | |

FOREIGN PATENT DOCUMENTS

| | | |
|---|---|---|
| JP | 2004266884 A | 9/2004 |
| WO | 2007143868 A1 | 12/2007 |

OTHER PUBLICATIONS

Li, S., et al.; Stacked High/Low Voltage Level H-Bridge Circuit for Gradient Amplifier of MRI System; 2008; IEEE Trans. on Int'l Conf. on Electrical Machines and Systems; pp. 2154-2158.

Liao, J., et al.; Cascaded H-bridge Multilevel Inverters—A Reexamination; 2007; IEEE Trans. on Vehicle Power and Propulsion Conference; pp. 203-207.

* cited by examiner

POWER SUPPLY, METHOD, AND COMPUTER PROGRAM PRODUCT FOR SUPPLYING ELECTRICAL POWER TO A LOAD

FIELD OF THE INVENTION

The invention relates to the design and control of pulse width modulated power supplies.

BACKGROUND OF THE INVENTION

In Magnetic Resonance Imaging (MRI), three gradient amplifiers and three associated magnetic field gradient coils are typically used to provide 3-dimensional spatial encoding of atomic spins located in a magnetic field.

These gradient amplifiers are typically characterized by high peak power (several 100 kW up to 2 MW for present-day specimens) and high precision of the generated current waveforms. Circuits consisting of series-connected full bridges using pulse-width modulation (PWM) have been used to construct gradient amplifiers.

This circuit topology is known under several names, such as "stacked H-bridges", "cascaded H-bridges", or "cascaded multicell converter". A severe disadvantage of the circuit is that every bridge needs an individual, floating power supply that is well-isolated against both low frequencies and high frequencies. Variations on this basic theme are possible, but at the cost of increased complexity and maintaining the need for multiple isolated power sources.

U.S. Pat. No. 7,116,166 B2 discloses the use of full bridge circuits for the construction of a gradient power supply for magnetic resonance imaging equipment.

SUMMARY OF THE INVENTION

The invention provides for a power supply, a method for operating a power supply and a computer program product for performing the method of operating the power supply in the independent claims. Embodiments of the invention are given in the dependent claims.

Embodiments of the invention address this previously mentioned problem by replacing one or more of the expensive direct current power supplies with a "floating capacitor." The charge on the capacitor is able to supply the current necessary for operation of the full bridge circuit. By controlling the modulation of the switches within the bridge circuit, the level of charge on the capacitor can be controlled and it is possible to operate embodiments of the invention continuously. The elimination of direct current power supplies reduces the manufacturing cost of the power supply.

A fundamental circuit in power electronics is the canonical switching cell. The canonical switching cell is typically discussed using ideal switches. However a more practical implementation is using Insulated Gate Bipolar Transistors (IGBT) with anti-parallel diodes as switches.

The canonical switching cell is used to control the power flow and thereby the exchange of energy between two systems. Two switches are operated such that the load is connected to either the positive or negative terminal of a voltage source. The switches are operated in a manner such that exactly one of these is closed at any time. Closing both switches is prohibited as this would create a short circuit across the voltage source and thereby possibly cause unlimited current flow; opening both switches would obstruct the current from the current source on the right to flow, possibly causing unlimited voltage rise. Two trigger signals control the state of the two switches such that when a trigger signal is 1 the switched is closed, and when the trigger signal equals 0 then the switch is open. Due to the constraint discussed above the two trigger signals are logical inverses of each other. Note that this is a very general and conceptual circuit: depending on the polarity of the voltage V and of the current I the power flow can be in either direction.

For the practical implementation of a switching cell, the voltage and current sources and the two switches can be replaced by physically realizable devices. The ideal voltage source can be replaced by a power supply in parallel with a capacitor, which provides a low-impedance path for high frequencies. The ideal switches can be replaced by IGBT switches with anti-parallel (also called "freewheeling") diodes. Due the presence of these diodes the supply voltage is now restricted to positive values, the current through a coil used as a load can still flow in either direction. As it takes a finite time to switch on or off an IGBT, a short time interval (the dead time) where neither signal is active should be introduced to prevent a short circuit due to both IGBT switches being (partially) conducting. In the sequel we will disregard this dead time interval to make the presentation as concise as possible.

The combination of two IGBT switches is defined as a phase leg; the origin of this name being that three of these circuits are necessary to build a three-phase voltage source inverter, which is presently the circuit of preference to drive medium power (ca. 100 W to 1 MW) induction motors.

The most common way a single phase leg is used is to control the power flow between the two attached systems is by using Pulse-Width Modulation (PWM). The simplest example of PWM is where two gate signals show a repetitive pattern in time. The first gate signal is turned on and conducting during an interval •Tk, and the second gate signal is turned on during the complementary interval (1−•)Tk, where Tk denotes the repetition interval.

Gate signal patterns can be generated in several ways. The earliest implementations, built with mainly analog circuitry, used a triangular (also called naturally sampled) or saw-tooth shaped carrier signal. Comparing a signal with actual value • to this carrier generates the gate signals. In more recent modulators, similar methods are used, but now implemented in digital devices (timers in DSP's or microcontrollers, FPGA's, ASIC's).

Combining two phase legs produces a circuit which is known as a full bridge or H-bridge. In a full bridge circuit, the average voltage across the load is now built up as the difference of the average voltages on the two switching nodes, i.e.

$$Vloadav = Vn + \delta_A Vsupply - \delta_B Vsupply = (\delta_A - \delta_B) Vsupply, \quad (1)$$

where Vloadav is the average load voltage, Vsupply is the supply voltage. It is assumed for the remainder of the discussion that Vsupply>0. It follows that by proper selection of the two duty cycles $•_A$ and $•_B$ both positive and negative load voltages, covering the full range from −Vsupply to +Vsupply can be generated. This is the origin of the name full bridge, and indeed, a single phase leg is often called a half bridge.

In principle, it is possible to use individual triangular or sawtooth carriers to generate the PWM signals for the two phase legs which constitute a full bridge, but it is often convenient and less resource-hungry to use the same carrier for both legs. Inspection of equation (1) reveals that a single value for Vloadav can be generated with multiple combinations of $•_A$ and $•_B$. One particular combination of these duty cycles is used in most cases as it produces the most symmetrical voltage between the two switching nodes, leading to the lowest ripple in the current through the load. The duty cycles for this particular combination are derived as follows:

Let Vloadav be the desired average voltage across the load (with obviously |Vloadav|<(Vsupply)). The duty cycle • for the full bridge is then defined by:

$$\delta = \frac{Vloadav}{Vsupply} \qquad (2)$$

The duty cycles for the individual phase legs are now obtained by:

$$\delta_A = \frac{1+\delta}{2} \text{ and } \delta_B = \frac{1-\delta}{2} \qquad (3)$$

Substituting these values in the formula (1) shows that indeed the desired value for Vloadav will be realized.

Embodiments of the invention provide for a power supply adapted for supplying electrical power to a load. The power supply comprises at least one powered full bridge circuit. The powered full bridge circuit is adapted for being powered by a direct current voltage supply. The direct current voltage supply can be a component of the powered full bridge circuit, or it can be a separate direct current voltage supply. In many embodiments it is advantageous to have the direct current voltage supply separate from the powered full bridge circuit. For example in magnetic resonance imaging, the power supply can be used for powering the magnetic field gradient coils. The magnetic field gradient coils are the largest consumer of electrical power in a magnetic resonance imaging system during operation. In one embodiment the power supply and the direct current voltage supply are integrated together. In another embodiment they are separate.

Each of the full bridge circuits comprises a first output connection. The full bridge circuit comprises a first switching means for controlling the application of electrical power to the output connection. The power supply further comprises at least one floating full bridge circuit. Each floating full bridge circuit comprises a capacitor adapted for powering a floating full bridge circuit. The use of a capacitor is advantageous, because it allows a direct current voltage supply to be eliminated from the circuit. This reduces the cost of the power supply.

Each floating full bridge circuit comprises a second output connection. Each floating full bridge circuit comprises a second switching means for controlling the application of electrical power to the output connection. The power supply further comprises a stack of bridge circuits comprising the at least one powered full bridge circuit and the at least one powered full bridge circuit. The second output connection and the first output connection are connected in series. The stack has a third output connection. The powered full bridge circuits and the floating full bridge circuits can be connected in series in any order. The first, second and third output connections can be connectors, or the bridge circuits can be hardwired together with wires, a circuit board, solid copper strips, or bus bars. The power supply further comprises a passive filter for averaging the voltage across the third output connection. The passive filter is connected to the third output connection. The power supply operates by switching the first and second switching means to control the voltage output at the third output connection. As this is a switching power supply, the voltage is not constant and does not change smoothly. The passive filter smoothes and averages the voltage across the third output connection. The power supply further comprises a load connector adapted for connecting the passive filter to the load. In some embodiments such as in magnetic resonance imaging where the power supply is used to power the magnetic field gradient coils, the load may form a portion or completely the passive filter. For example these magnetic field gradient coils have a large inductance. This inductance can be used as a component of the passive filter. The load connector can be a connection system for connecting the load to the passive filter, or the filter can be hardwired to the load and the passive filter can also be integrated into the load if the load forms a portion of the passive filter. The power supply further comprises a modulator adapted for modulating the first switching means and the second switching means such that the energy necessary for charging or discharging of the capacitor's control electrical power is being supplied to or extracted from the load. The modulator can be implemented using a microcontroller, a computer, a Field Programmable Gate Array (FPGA), Complex Programmable Logic Device (CPLD), Application Specific Integrated Circuit (ASIC), or a control system. This power supply is advantageous, because the modulator is designed to control the charging or discharging of the capacitor. This allows the power supply to be constructed with a reduced number of direct current voltage supplies. Controlling the discharging or charging of the capacitor also allows the power supply to be operated continuously.

In another embodiment, the power supply comprises two or more powered full bridge circuits. This embodiment is advantageous, because the power requirements of the load circuit may be large enough that more than one direct current voltage supply is necessary.

In another embodiment, the power supply further comprises a current measuring means adapted for measuring the current through the load. The modulator is further adapted for controlling the current to the load using the current measurement by adjusting the modulation of the first switching means and the second switching means. This embodiment is advantageous, because for some applications such as magnetic resonance imaging where the magnetic field gradient coils are powered by the power supply, that the current through the coils determines the magnetic field generated by the gradient coils. To accurately control these coils, a feedback system is used to adjust the current to the proper levels. Small inhomogeneities in the magnetic field can cause problems in magnetic resonance imaging, so this embodiment improves the quality of magnetic resonance imaging data.

Several possible ways of implementing the current measuring means are: using an ammeter, making a voltage measurement across a resistor, or measuring the potential induced in a coil, using a specialized integrated circuit, using saturation phenomena in a magnetic circuit, and using a Hall-effect sensor in a magnetic circuit. The Hall-effect sensor can be combined with an open-loop, closed-loop, or both an open-loop and closed-loop electrical circuit.

In another embodiment, the modulator is adapted for modulating the first switching means and the second switching means at the same average frequency. This embodiment is advantageous, because it simplifies the design of the modulation pulses for the first and second switching means. This embodiment is also advantageous, because the same hardware can be used for modulating the first and second switching means.

In another embodiment, the modulation means is adapted for modulating the first switching means and the second switching means such that the ripple frequency of the voltage applied to the load is constant and higher than the average switching frequency of said first and second switching means. The ripple frequency of the voltage applied to the load is a measure of how smooth the voltage will be. For many applications such as magnetic resonance imaging it is advantageous to have this ripple frequency as high as possible. This embodiment allows a ripple frequency that is higher than the switching frequency. For example in magnetic resonance imaging this improves the quality of the images acquired.

In another embodiment, the passive filter comprises the load. This is advantageous, because in many applications the load has an impedance that would affect the passive filter. When a known load is used, the passive filter can be designed to incorporate the impedance of the load.

In another embodiment, the power supply further comprises a second current measuring means adapted for measuring the current through the filter circuit. The second current measuring means can be implemented in the same way as the previously discussed current measuring means.

In another embodiment, the power supply further comprises a voltage measuring means adapted for measuring the voltage in the filter circuit. Possible ways that the voltage measuring means can be implemented include: a field effect based amplifier, a specialized integrated circuit such as an instrumentation amplifier, and using any type of current sensor with a series resistance for the conversion of voltage to current.

In another embodiment, the modulator is adapted for modulating the first switching means and the second switching means in cycles. The modulator is adapted for modulating the first switching means and the second switching means in any one of the following ways: at least two rising edges per cycle of the voltage across the first output connection and the voltage across the stack are aligned, at least two falling edges per cycle of the voltage across the first output connection and the voltage across the stack are aligned, and at least one rising edge and at least one falling edge on the voltage across the first output connection and the voltage across the stack are aligned. This embodiment is advantageous, because it simplifies the design of the modulators and pulses.

In another embodiment the load has an inductance. The modulator is adapted for modulating the first switching means and the second switching means such that the capacitors are charged or discharged using electrical energy stored in the load. This is advantageous because it reduces the number of direct current voltage supplies needed, and it also reduces energy consumption by re-using energy stored within the inductance of the load.

In another embodiment, the modulator is adapted such that the electrical power supplied to the load is a function of time. The modulator is adapted for modulating the first switching means at a first a first rate and the ripple frequency of the voltage measured across the load connection means is higher than the first rate. The advantage of increasing the ripple frequency has already been discussed.

In another embodiment, the modulation means is adapted for modulating the first switching means at a second rate, wherein the number of the at least one floating bridge circuits is M−1, wherein the modulation means is adapted for modulating the first switching means and the second switching means such that the ripple frequency of the voltage measured across the load connecting means is (M+1)/2 times the second rate.

In another embodiment, the modulator is adapted for modulating the first switching means and the second switching means such that the power supply is able to supply power to the load continuously. This embodiment is advantageous, because the modulation pulses have been designed such that the capacitors stay charged and are able to supply or absorb power.

In another embodiment, the load is a magnetic resonance imaging gradient coil.

In another aspect the invention provides for a method for controlling a power supply. The method comprises modulating the first switching means and the second switching means such that the first switching means and the second switching means operate at the same average frequency. The method further comprises adjusting the modulation of the first switching means and the second switching means such that the charging or discharging of the floating capacitor is controlled while electrical power is being supplied to the load. The method further comprises adjusting the modulation of the first switching means and the second switching means such that the ripple frequency of the voltage applied to the load is constant and higher than the switching frequency of the first and second switching means. The advantages of these steps have already been discussed.

In another aspect the computer program product comprises a set of machine executable instructions for performing the method.

BRIEF DESCRIPTION OF THE DRAWINGS

In the following preferred embodiments of the invention will be described, by way of example only, and with reference to the drawings in which.

DETAILED DESCRIPTION

Figure 1:
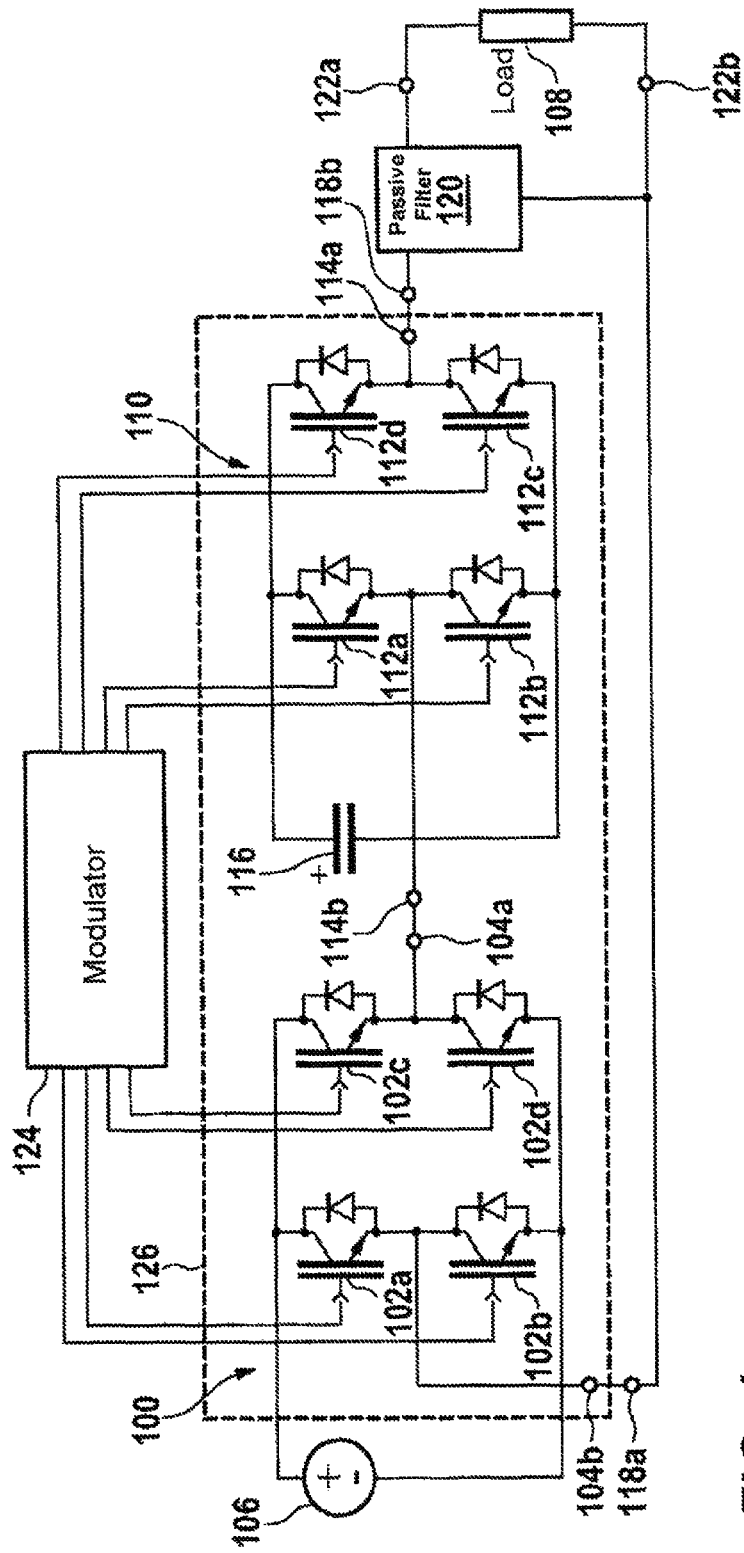
FIG. 1 shows a schematic of an embodiment of a power supply according to the invention.

FIG. 1 shows an embodiment of a power supply according to the invention. The power supply in this embodiment has a single powered full bridge circuit 100 and a single floating full bridge circuit 110. The full bridge circuit 100 comprises a first switching means 102a, 102b, 102c, 102d. The first switching means in this embodiment is constructed using insulated gate bipolar transistors (IGBT) with antiparallel diodes. Each full bridge circuit and floating full bridge circuit is constructed from two phase legs. In the powered full bridge circuit 100 the first phase leg comprises element 102a and element 102b. The second phase leg comprises element 102c and element 102d. Elements 102a and 102b are switched in conjunction and elements 102c and 102d are switched in conjunction. Only one of the switches in a phase leg is switched on at any given time. For instance, if 102a and 102b were both switched on at the same time then the DC power supply 106 would be shorted. Elements 102a and 102b are connected in series. Elements 102c and 102d are also connected in series.

The first phase leg and the second phase leg are then connected to the same DC voltage supply to construct a full bridge circuit. The first switching means is then connected to the DC power supply 106. The first output connection is connected in between elements 102a and 102b and a second connection for the first output connection is between elements 102c and 102d. The switching means 102a, 102b, 102c, 102d of the powered full bridge circuit 100 are all connected to the modulator 124. The modulator is able to control the powered full bridge circuit 100 such that the first output connection 104a, 104b either has the DC voltage of 106, no voltage or minus the voltage of the direct current voltage supply 106. The direct current voltage supply 106 can be a part of the powered full bridge circuit or it can be a separate component. For applications where very large powers are supplied such as in magnetic resonance imaging for the powering of magnetic field gradient coils, it may be advantageous to have a separate DC power supply; however in some situations the DC power supply 106 would be integrated into the powered full bridge circuit.

The floating full bridge circuit 110 comprises a switching means 112a, 112b, 112c, 112d, and a capacitor 116. Elements 112a and 112b form the first phase leg and elements 112c and 112d form the second phase leg. Elements 112a and 112b are connected in series together. Elements 112d and 112c are also connected together in series. The first phase leg and the second phase leg are then connected to the capacitor 116 to obtain a full bridge. The second output 114b has a connection between elements 112a and 112b. The second output 114a also has a connection between elements 112d and 112c. The floating full bridge circuit 110 functions in the same way as the powered full bridge circuit 100 does. The difference is that instead of being powered by a direct current voltage supply 106, this bridge circuit is powered by a capacitor 116. Each of the elements of the second switching means 112a, 112b, 112c, 112d is connected to the modulator 124.

Similarly the modulator controls the voltage at the second output connection 114b and 114a. The voltage at the second output connection 114a, 114b will either be the voltage of the capacitor 116, no voltage or opposite the voltage of the capacitor 116. The powered full bridge circuit 100 is connected in series with the floating full bridge circuit 110. They are connected between the first output connection 104a and the second output connection 114b. The combined powered full bridge circuit 100 and floating full bridge circuit 110 comprise the stack of bridge circuits 126. The stack of full bridge circuits 126 has a third output connection 118a and 118b. Output connection 118a is connected to the output of the first output connection 104b and the output 118b of the third output connection is connected to output 114a of the second output connection. A passive filter 120 is connected to the third output connection 118a and 118b. The passive filter serves to smooth the voltage signal. The output filter is connected to a load connection 122a and 122b. Load 108 is connected to the load connectors 122a and 122b. In this embodiment the first, second, and third load connectors are shown as being discreet connections. In some embodiments however, these will be hardwired connections.

The circuit shows a filter 120 which is a two port device, in this example using three terminals. In another embodiment the filter 120 can also be a four terminal device. In some embodiments the filter can be integrated into the load 108. Also in some embodiments the impedance of the load can function as part of the filter 120.

Figure 2:
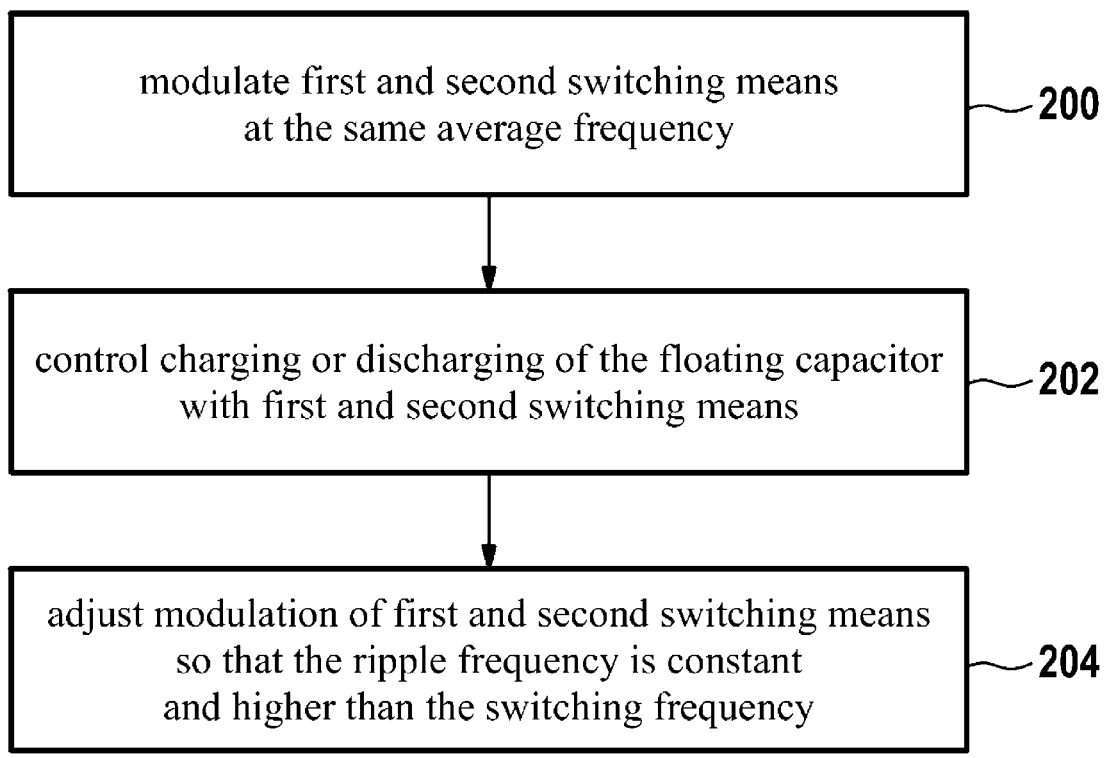
FIG. 2 shows an embodiment of a method of operating a power supply according to the invention.

FIG. 2 shows an embodiment of a method for controlling an embodiment of a power supply according to the invention. The method comprises step 200 which is to modulate the first switching means and the second switching means such that the first switching means and the second switching means operate at the same average frequency. In step 202 the modulation of the first and second switching means are adjusted such that the charging or discharging of the floating capacitor is controlled while electrical power is being supplied to the load. Control of the charging or discharging of the capacitor is crucial to maintaining a supply of power from the floating full bridge circuit. In step 204 the modulation of the first and second switching means is adjusted such that the ripple frequency of the voltage applied to the load is constant and is higher than the switching frequency of said first and second switching means.

Figure 3:
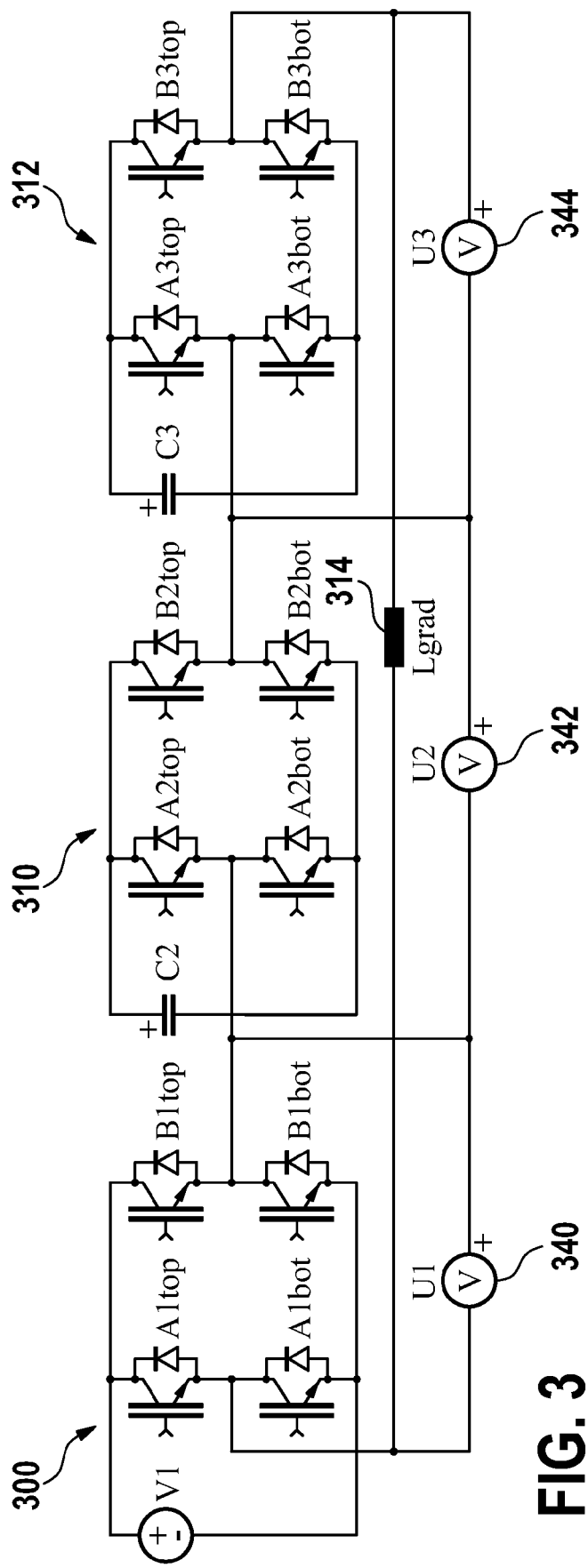
FIG. 3 shows a schematic of a further embodiment of a power supply according to the invention.

FIG. 3 shows an embodiment of a power supply according to the invention. Not all details shown in FIG. 1 are included or labelled in the embodiment shown in FIG. 3. This convention is followed for other embodiments of the power supply which follow also. For instance it is understood that there is a modulator which controls the switching means of individual bridge circuits. Also the individual components of the bridge circuits are not described in detail. The filter is also not shown in the embodiment of FIG. 3, or in subsequent embodiments.

The embodiment in FIG. 3 has a powered full bridge circuit 300, a first floating full bridge circuit 310, and a second floating full bridge circuit 312. These three full bridge circuits are connected together in series. The output connections of these full bridge circuits are then connected to a load 314. Three test elements 340, 342 and 344 are also visible. These are labelled as U1, U2, and U3 and are measuring devices which indicate the voltage produced by each individual full bridge. These display the voltage across each of the bridge circuits and are intended to facilitate the explanation of the function of the power supply. Element 340 is connected in across the output terminals of the powered full bridge circuit 300. Voltage measurement 342 is connected across the output terminals of the first floating full bridge circuit 310 and voltage measurement 344 is connected across the output terminals of the second floating full bridge circuit 312.

A circuit consisting of series-connected full bridges, with only one of these supplied externally, and the remaining bridges supplied only by a bulk DC link capacitor, can operate with a single power supply, which can furthermore be combined for the three axes (X, Y, Z) which normally make up a complete MRI gradient amplifier. An example for M=3 is give in FIG. 3, where M is the number of full bridge circuits, both floating and powered, in the power supply.

The embodiment shown in FIG. 3 will be discussed extensively. The theory of operation of a power supply for values of M>3 is analogous to the M=3 case.

In the steady-state (effectively providing DC current to the gradient coil for extended times), without further measures, the DC link capacitors of the floating full bridges will discharge as they have to supply a part of the resistive losses in the gradient coil and losses in other circuit parts. After a finite time, the voltages across C2 and C3 will have been reduced to zero, effectively removing the floating full bridges from the circuit. This implies that the ripple frequency will then be equal to the (lower) ripple frequency of the powered full bridge, and therefore the amplitude of the ripple in the coil current will increase. In the MRI application most of the essential information is gathered exactly in this phase of the gradient current flow, and very severe requirements apply to the ripple in order to obtain the desired high resolution in the image.

Embodiments of the invention addresses the generation of firing signals for the active power devices making up the floating and powered full bridges in such a way that may include:

Allow precise control of the state of charge of the floating capacitors,

Obtain a ripple frequency of (M+1)/2 times the value of a single H-bridge, i.e. twice the frequency for three bridges, Operate all bridges at the same average switching frequency, allowing identical electrical and thermal layouts and thereby a modular design to be used.

The generator achieves this by partial compensation of the voltage pulses generated by the powered full bridge by using pulses generated by one or more of the floating full bridges. This compensation scheme is fully possible for any odd value of the number of bridges M. A partial solution where the average switching frequencies of the floating and powered full bridges are not equal is possible for even values of M.

Figure 4:
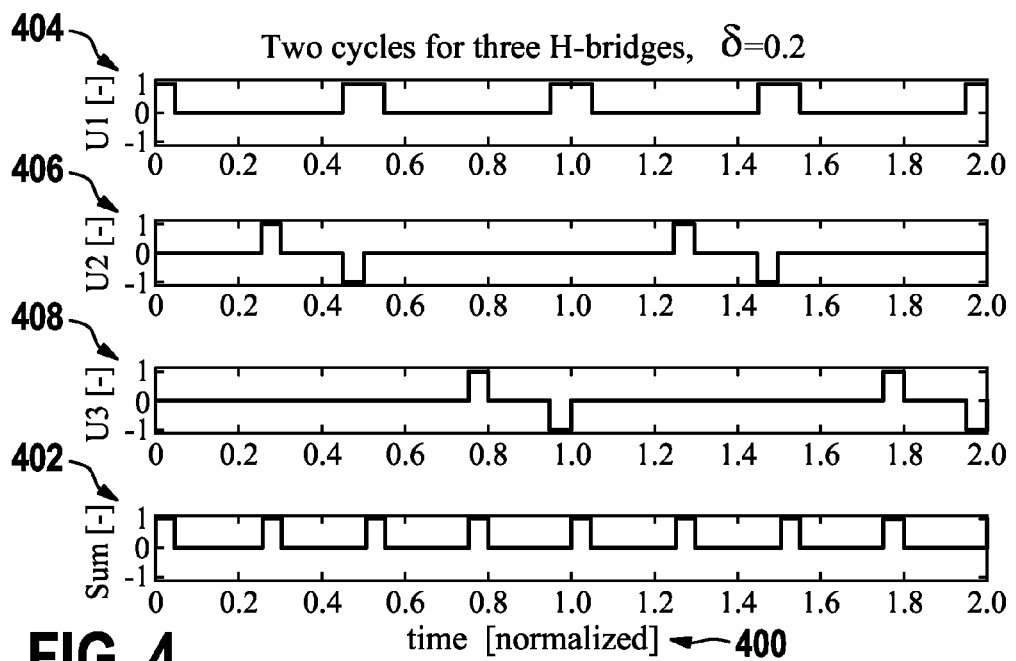
FIG. 4 shows an illustration of a pulse modulation pattern for operating a power supply according to an embodiment of the invention.

The following discussion assumes that the supply voltages of the floating and powered bridges are equal. FIG. 4 shows the voltage output of the power supply and the voltages across each of the full bridge circuits as a function of time. The time axis is labelled 400. Trace 404 shows a voltage at voltage measurement 340, trace 406 shows a voltage measurement at element 342 of FIG. 3 and measurement 408 shows a voltage measurement across element 344 of FIG. 3. Voltage measurement 402 in FIG. 4 is a sum of the voltages across measurements 340, 342, and 344 of FIG. 3. 402 represents the total output of the power supply shown in FIG. 3. FIG. 4 shows an illustration of pulse snooping using three stacked H-bridges. Top trace 404: U1=voltage produced by the powered full bridge, second trace 406: U2=voltage produced by the first floating full bridge, third trace 408: U3=voltage produced by the second floating full bridge, lower trace 402: the net result, being the sum of U1, U2, and U3. For the polarity of U1, U2, U3 please refer to FIG. 3.

To increase the net frequency as perceived by the gradient coil (leading to less flux change per pulse and thereby a lower current ripple), the two floating full bridges can be used to "snoop off" some of the pulse area of the powered full bridge and move it to another location in time. Every pulse snooped from the powered full bridge leads to two pulses in a floating full bridge, therefore using two of these, operating in interleaved mode, leads to the same net switching frequency for all bridges. Consequently, the switching and (average) conduction losses will be more or less equal for all bridges, which allows the same hardware to be used for all of them. An example of the pulse snooping idea, using three stacked H-bridges, is shown in FIG. 4.

In FIG. 4 the powered full bridge is operating at a duty cycle • of 0.2 and a normalized switching frequency of 1 per phase leg. The pulse frequency of the voltage produced by this bridge is twice as large, i.e. 2 pulses per time unit in this example. One of the floating full bridges (U2) is operated such that near t=0.5 half of the pulse area produced by the powered full bridge (U1) is compensated for by adding a negative "correction" pulse with half the width of the pulse of the powered full bridge. U2 also produces a positive pulse with the same area near t=0.3. Near t=1 the other powered full bridge (U3) produces a negative pulse, again snooping off half of the U1 area. Finally, near t=0.8 U3 adds a positive "correction" pulse with the same area.

This pattern is repeated in the interval from t=1 to t=2. The voltage applied to the gradient coil is the sum of the voltages of the floating and powered full bridges, and has a ripple frequency which is twice as high as the ripple frequency of U1, as is shown in the lower trace of FIG. 4. Assuming a constant gradient current, the net power supplied by the floating full bridges is zero, but as the voltage areas presented to the gradient coil are two times smaller than in the case with only U1 active, the peak-peak current ripple has also been approximately halved.

If a passive (L/C) filter with an appropriate cut-off frequency is added in the circuit, the ripple reduction will be even more pronounced due to the higher attenuation of the filter at the increased ripple frequency.

Figure 5:
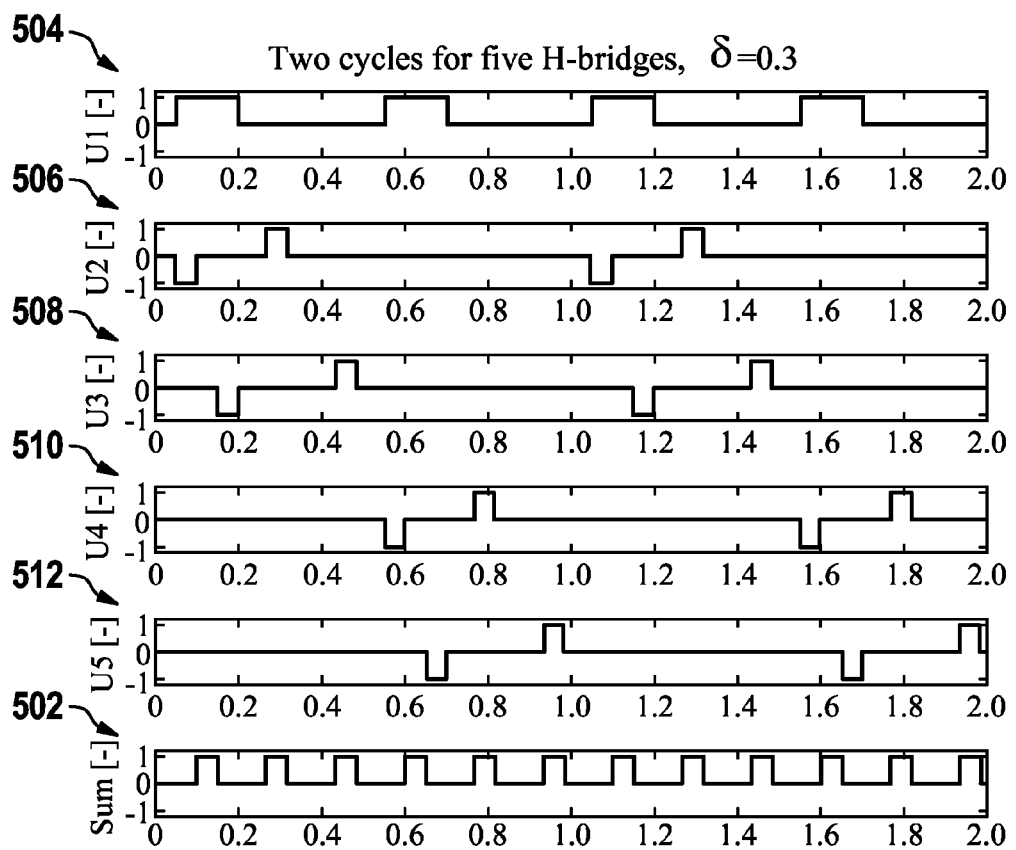
FIG. 5 shows a further illustration of a pulse modulation pattern for operating a power supply according to an embodiment of the invention.

A compensation pattern for M=5 is shown in FIG. 5, where the snooping process is illustrated for a duty cycle • of 0.3 and 5 stacked H-bridges. FIG. 5 shows a similar plot as was shown in FIG. 4, however the circuit now has one powered full bridge circuit and four floating full bridge circuits. FIG. 5 shows an illustration of pulse snooping using five stacked H-bridges. Top trace 504: U1=voltage produced by the powered full bridge, middle traces: U2 506, U3 508, U4 510, U5 512=voltages produced by the respective floating full bridges; lower trace: the net result, being the sum of U1, U2, U3, U4 and U5.

FIG. 5 shows the voltages across each of the individual full bridge circuits and the total output of the power supply. The time axis is 500, 504 shows the voltage output of the powered full bridge circuit. 506, 508, 510 and 512 show the voltages across the four floating full bridge circuits. 502 shows the sum of the voltages across all five full bridge circuits which equals the overall output voltage of the power supply.

In the example of FIG. 5, two times one-third of every pulse of the powered full bridge (U1) is snooped off, with the result that a net pulse of a third of the original width remains. The snooped area is compensated later in time with two individual pulses with one third of the original width. The result, shown in the lower trace 502 of FIG. 5, is that we obtain a three-fold increased pulse frequency in the voltage applied to the gradient coil. For other odd values of M, the same reasoning can be followed as for the cases M=3 and M=5 discussed above.

Figure 6:
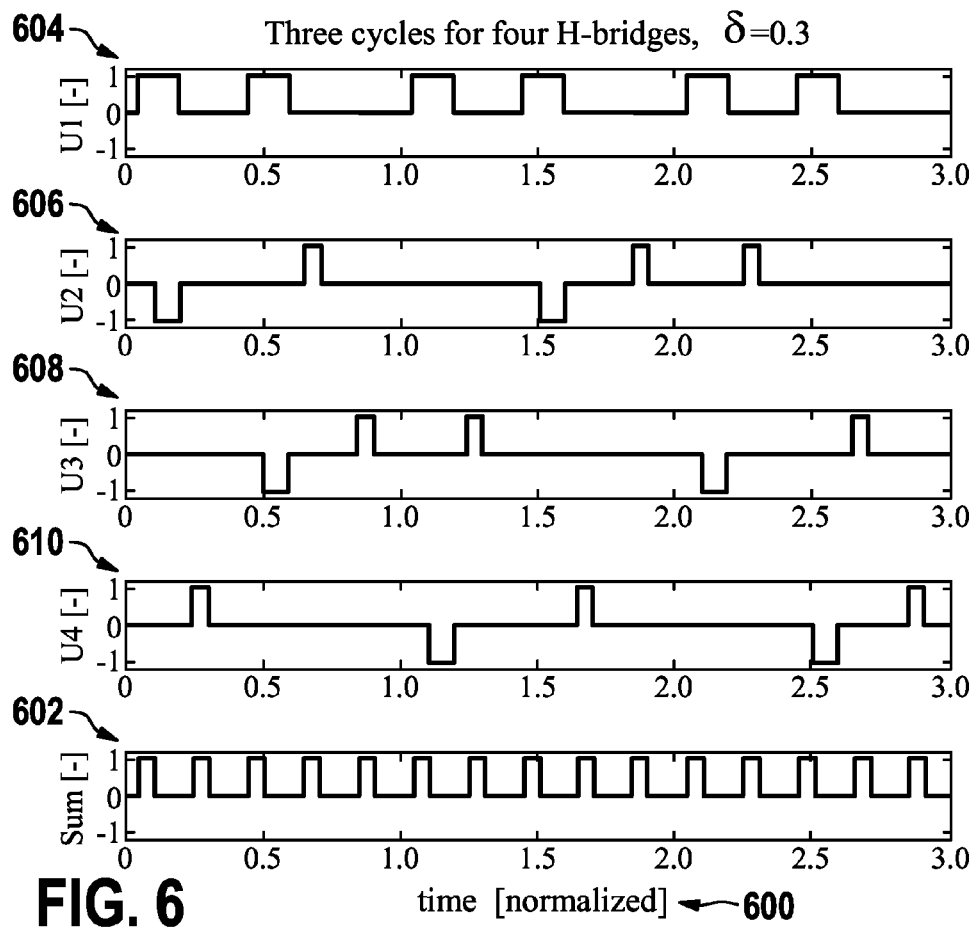
FIG. 6 shows a further illustration of a pulse modulation pattern for operating a power supply according to an embodiment of the invention.

For even values of M the snooping process can still be used, but the implementation is more complex than for odd values of M, and the average switching frequencies of the individual H-bridges are not strictly equal anymore. An example for M=4 is shown in FIG. 6. FIG. 6 shows the voltage across four stacked full bridge circuits as a function of time 603. 604, 606, 608 and 610 show the individual voltages of the four full bridge circuits. 602 shows the sum of the voltages across the four full bridges and is the output of the power supply.

FIG. 6 shows an illustration of pulse snooping using four stacked H-bridges. Top trace 604: U1=voltage produced by the powered full bridge, middle traces: U2 606,U3 608,U4 610=voltages produced by the respective floating full bridges; lower trace 602: the net result, being the sum of U1, U2, U3 and U4.

The example for M=4 in FIG. 6 demonstrates that the pulse patterns now show a less repetitive behavior than for the M=odd cases shown before. Also, the pulse pattern for the powered full bridge (U1) must necessarily be less regular than before, which leads to higher ripple in the supply voltage and more stress to the power components. In general, although solutions for M=even appear to be feasible, these should be considered as suboptimal, and the true strength of the pulse snooping process is best shown for M=odd.

If the floating full bridges are allowed during a certain switching interval to supply net energy to (or absorb from) the load, a similar pulse area compensation and ripple reduction is possible in almost all operating areas. Due to the power extracted from or supplied to the floating full bridges, the charge of and voltage across their DC-link capacitors will vary. The small variations in DC-link voltage can be compensated for by changing the duty cycle of the bridge in question accordingly, such that the net voltage integral per pulse remains the same. We will assume that such a compensating mechanism is in place, and neglect these small voltage variations in the following discussion. In the following, the case of M=3 bridges will be discussed in detail. Extension to other odd values of M, in accordance with the previous examples, is straightforward and will not be discussed here.

For the treatment to follow, first some notation is introduced:

| Variable | Meaning | Range |
| --- | --- | --- |
| • | Duty cycle of powered full bridge | −1 ··· 1 |
| •₁ | Duty cycle of the first floating full bridge | −1 ··•₁· 1 |
| •₂ | Duty cycle of the second floating full bridge | −1 ··•₂· 1 |
| • | Sum of the duty cycles of the two floating full bridges, • = •₁ + •₂ | −2 ··· 2 |
| •* | Duty cycle of the whole circuit, •* = • + • | −3 ··•*· 3 |
| •ₓ | Reduced duty cycle (definition follows) | −0.5 < •ₓ < 0.5 |

The operating range of the three connected bridges can now be viewed as a cube spanned by three coordinates (•₁,•₂,•). As this is somewhat hard to visualize, we will discuss the simplified case where both floating full bridges are treated equally (which in view of the advantage of symmetry in the three bridge supply voltages will normally be the case), so that •₁=•₂=•/2. With this constraint, the operating range can be viewed as a plane spanned by coordinates (•,•).

Assuming that set point values for (•,•) are available, generation of the desired switching patterns for the three bridges is straightforward. This will be illustrated using the signals in FIG. 7.

Figure 7:
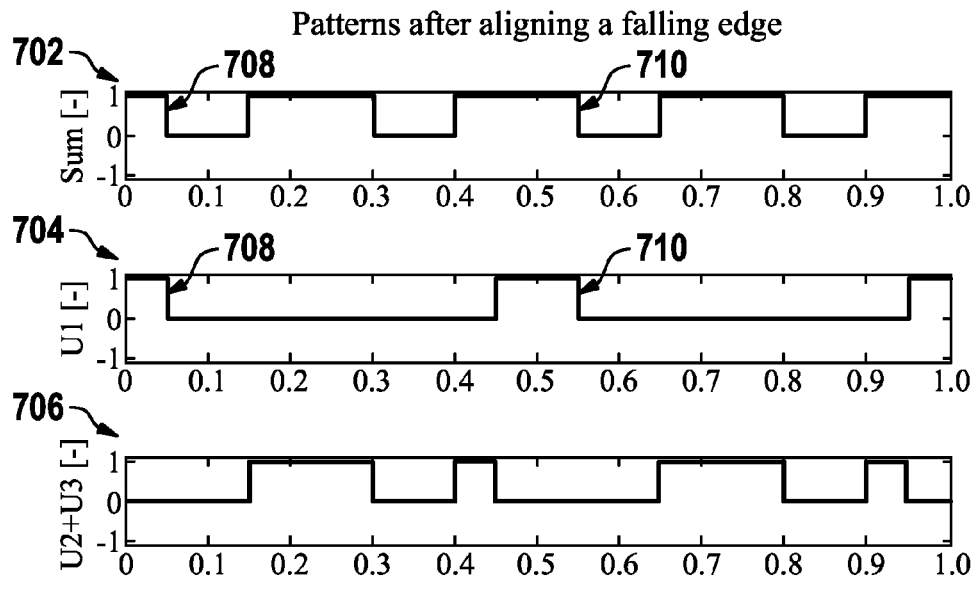
FIG. 7 shows a further illustration of a pulse modulation pattern for operating a power supply according to an embodiment of the invention.

FIG. 7 shows how to construct the pulse patterns to maintain a power supply with one powered full bridge circuit and two floating full bridge circuits in a stack. The time axis is 700. 702 shows the desired output of the power supply. 704 shows the voltage output of the powered full bridge circuit. There are two falling edges of 702 and 704 aligned: 708 and 710. 706 shows the sum of the voltages produced by the floating bridges which are required in order to generate voltage pattern 702 with 704. FIG. 7 shows example of pulse patterns for •=0.2 and •=0.4. Upper trace 702: Sum, i.e. the (normalized) voltage to be applied to the gradient coil; middle trace 704: U1, the voltage produced by the powered full bridge; lower trace 706: U2+U3, i.e. the sum of the voltages produced by the floating full bridges.

The upper trace in FIG. 7 represents the voltage to be applied to the gradient coil, which is the sum of the individual bridge output voltages, i.e. Sum=U1+U2+U3. This is a signal with duty cycle •*=•+•=0.6 and a frequency of 4 pulses per time unit. The middle trace 704 represents the voltage U1 of the powered full bridge, which is a signal with duty cycle •=0.2 and a frequency of 2 pulses per time unit. The voltage to be generated by the two floating full bridges (U2+U3) is now obtained by subtracting these signals, i.e. (U2+U3)=Sum−U1. Note that the phase relation between the signals for the floating and powered full bridges has been chosen such that two edges per cycle of both signals are aligned (in FIG. 7 these are the falling edges at t=0.05 and t=0.55). With this phase relation the lower trace in FIG. 7 results, featuring a pulse frequency of 4 per time unit The pulse pattern per individual powered full bridge is now obtained by distributing the edges of the signal (U2+U3) in the lower trace 706 of FIG. 7 equally and symmetrically over U2 and U3. This can be performed in several ways, one of which is shown in FIG. 8.

Figure 8:
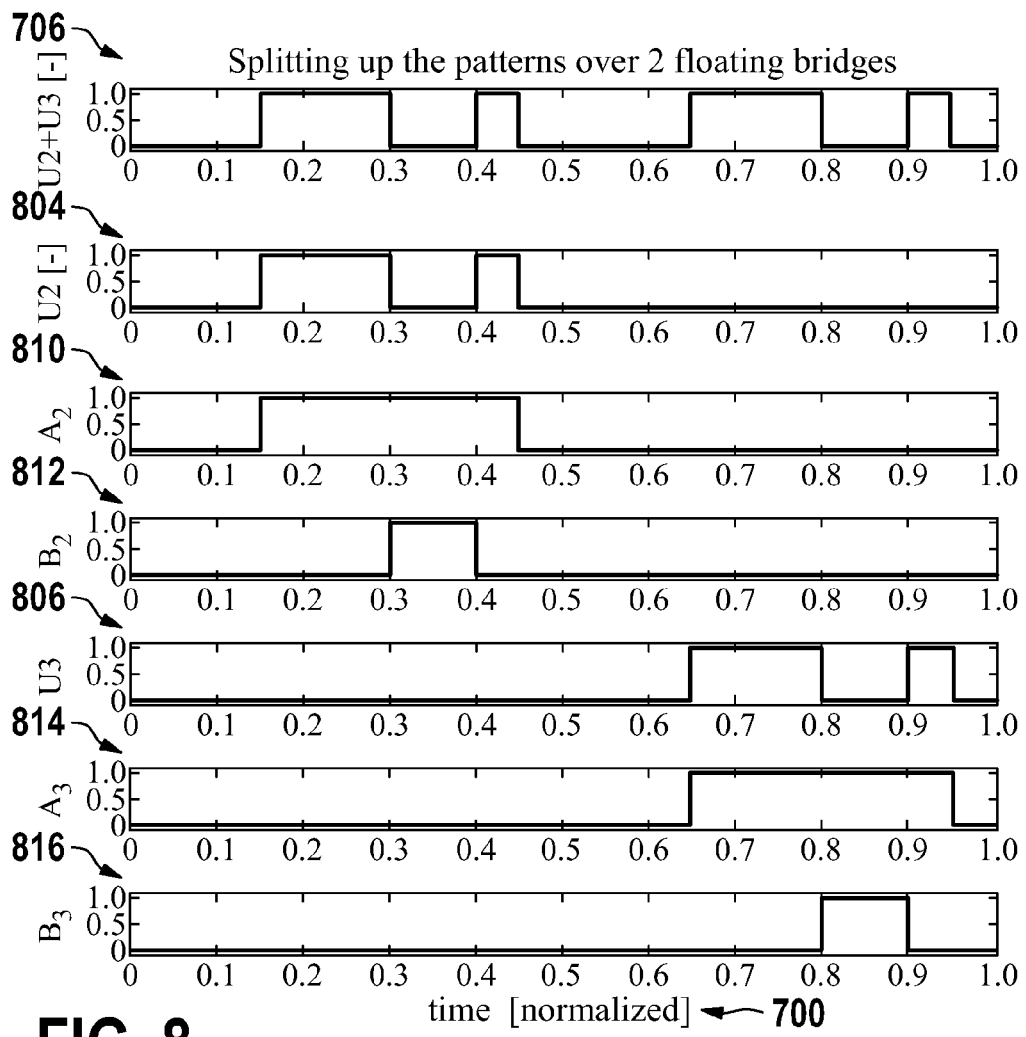
FIG. 8 shows a further illustration of a pulse modulation pattern for operating a power supply according to an embodiment of the invention.

FIG. 8 is a continuation of FIG. 7, showing examples of splitting up the pattern for • (U2+U3) into the patterns for the individual phase legs of the floating H-bridges: A2 810, B2 812, A3 814, B3 816. In FIG. 8, the time axis 700 is the same on both figures as is 706. The voltage across the first floating full bridge circuit is 804 and the voltage across the second floating full bridge circuit is 806. 804 and 810, 810 and 812 show the voltage across the individual phase legs of the first floating full bridge circuit. 814 and 816 show the voltage across the individual phase legs of the second floating full bridge circuit.

The pulse pattern for (U2+U3) has been redrawn in the upper trace 706 of FIG. 8. Assigning the first four switching events to U2 804 and the last four events in the displayed interval to U3 806 a possible realization of the switching patterns per phase leg as shown can be obtained. It must be stressed that the patterns shown in FIG. 8 are not the only ones possible. The following freedom exists:

Assignment of the switching events in (U2+U3) to the two floating full bridges (U2 and U3).

Assignment of null vectors per powered full bridge. A net output of 0 can be produced either by the combination (high, high) or (low, low) per phase leg.

In the cases where multiple solutions are possible, a further selection can be made based on for example minimizing the ripple current in the DC link capacitors of the floating full bridges or ease of generation and continuity of the timing signals. Applying the derivation illustrated with FIG. 7 and FIG. 8, it was found that frequency doubling is possible in most of the (•,•) plane.

Figure 9:
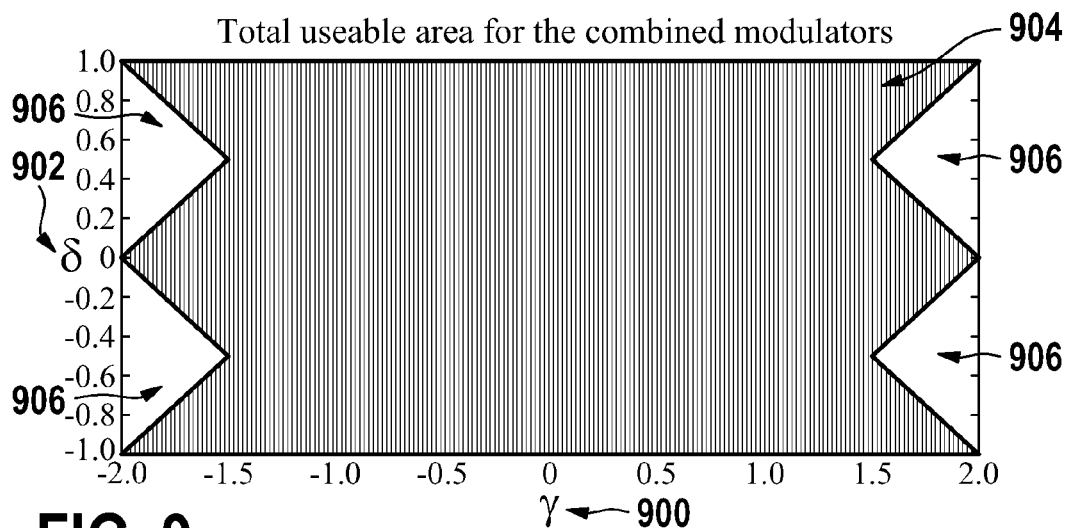
FIG. 9 shows the regions where an embodiment of a power supply according to the invention can be operated such that the ripple frequency can be doubled as a function of • and •.

FIG. 9 shows the regions where the ripple frequency can be doubled as a function of • and •: the duty cycle of two floating full bridge circuits 900 and as a function of the duty cycle of a powered full bridge circuit 902. The hatched region 904 shows a region where the ripple frequency can be doubled. In the regions 906 the ripple frequency cannot be doubled.

In the unreachable (unhatched, triangular) areas labeled 906 of FIG. 9 the voltage ripple also contains components equal to the frequency of a single bridge. These components increase gradually as the edge of the (•,•) plane is approached. The worst case ripple is found in the points (•,•)=(2,0.5), (2,−0.5), (−2,0.5) and (−2,−0.5). In these points the floating full bridges are completely saturated, and only the powered full bridge is switching, which explains the lower ripple frequency.

In the white areas 906 of FIG. 9 an approximation to the optimal behavior can be made by distributing the individual pulses over time as evenly as possible. An example is shown in FIG. 10.

Figure 10:
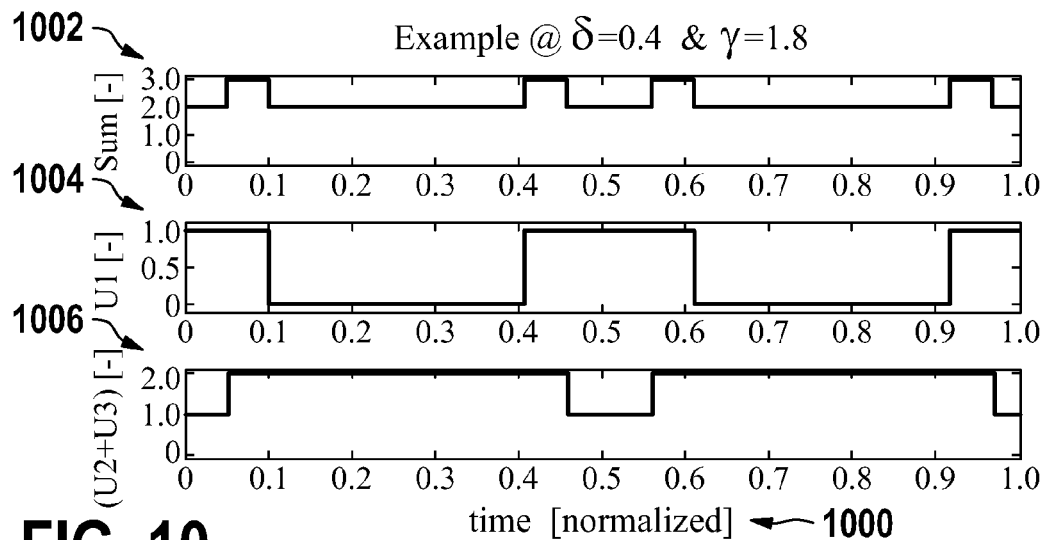
FIG. 10 shows a further illustration of a pulse modulation pattern for operating a power supply according to an embodiment of the invention.

FIG. 10 shows an example of a pulse pattern for the full bridge circuits for one of the regions 906 shown in FIG. 9. 1000 is the time axis, 1002 shows the output of the power supply, 104 shows the output of the powered full bridge circuit and 106 shows the sum of the two floating full bridge circuits.

In the example shown in FIG. 10, the average value of the voltage applied to the gradient coil equals 2.2 units. This can be realized with a signal which is 2 during 80% of the time, and 3 for the remaining 20% of the time. The value 3 can be realized only when the powered full bridge has value 1; therefore the 4 pulses of the upper trace in FIG. 10 need to occur at instants where the middle trace is high. The resulting pattern for the combined floating full bridges is shown in the lower trace; it shows a pulse frequency which is only half the value compared to the pattern observed in FIG. 7. This pattern can be generated by switching only one phase leg per floating full bridge.

As has been discussed in relation to FIG. 8, the decomposition of a signal (U2+U3) into the signals U2 and U3 of the individual bridges is possible in several ways. There is also freedom in the decomposition of a single $U_i$ signal into the signals $A_i$ and $B_i$ describing the behavior of the individual phase legs of the full bridge. In particular, a desired value $U_i=0$ can be produced by two phase leg combinations: $(A_i, B_i)=(0,0)$ or $(A_i,B_i)=(1,1)$.

One realization of the switching instants is shown where all instants are defined as continuous functions of • and •. This particular realization has a distinct advantage for an implementation, as no special measures are needed to prevent glitches in the gating signals for the individual phase legs. In fact, the switch timing of the individual phase legs can easily be derived using a saw tooth carrier wave or similar timing device. The modulation of the powered full bridge can be implemented with a classical triangle-wave carrier. These carriers are shown in FIG. 11.

Figure 11:
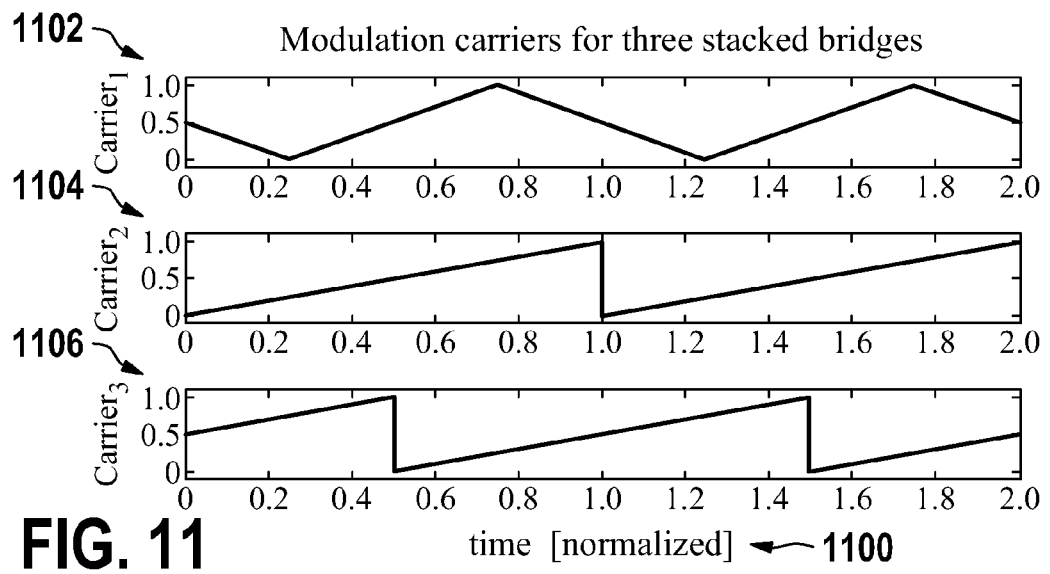
FIG. 11 shows an illustration of modulation carriers for modulating a power supply according to an embodiment of the invention.

FIG. 11 shows the modulation carriers for the pulse patterns shown in FIG. 10. 1100 is the time axis. 1102 is the triangle carrier for the powered full bridge circuit. 1104 and 1106 are the saw tooth carriers for the two floating full bridge circuits.

Note that the carriers for the two powered full bridges have the same shape but feature a phase shift of 180 degrees between them. 180 degrees is equivalent to 0.5 normalized time units.

The timing instants for the individual phase legs of a powered full bridge can now be created by comparing the carrier wave forms with levels whose value is derived from the set points for • and •. Usually, these levels are only varying slowly in time compared to the frequency of the carrier waveforms, on the time scale of the carrier wave forms these levels can be treated approximately as DC values.

For brevity of notation, a variable $•_x$, the term reduced duty cycle, is introduced, with the following mathematical definition:

$$\delta < -\frac{1}{2} \Rightarrow \delta_x = -1 - \delta \quad (4)$$

$$-\frac{1}{2} \leq \delta \leq \frac{1}{2} \Rightarrow \delta_x = \delta$$

$$\frac{1}{2} < \delta \Rightarrow \delta_x = 1 - \delta$$

Figure 12:
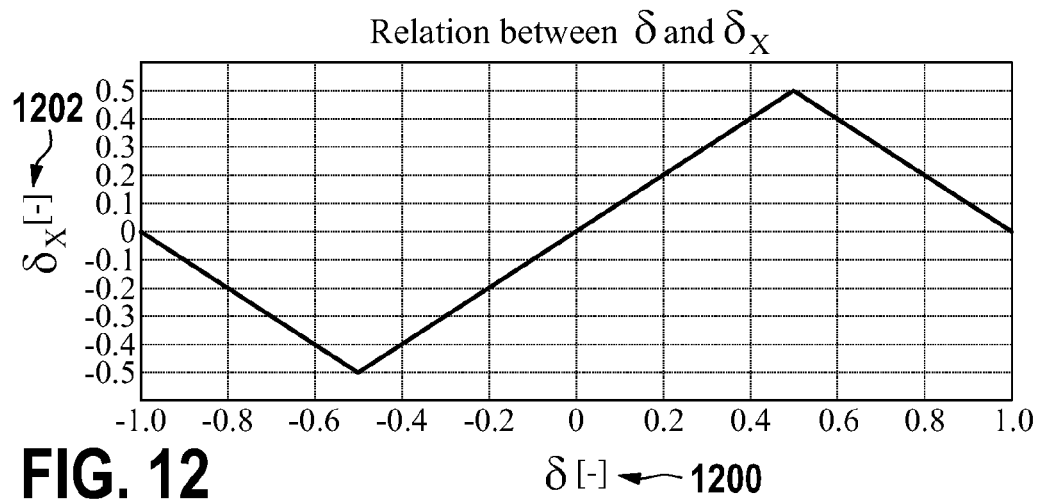
FIG. 12 shows an illustration showing the relation between the function of the duty cycle of the powered full bridge and the reduced duty cycle for a power supply according to an embodiment of the invention.

FIG. 12 graphically shows the relation between duty cycle • of the powered full bridge 1200 and the reduced duty cycle $•_x$ 1202.

For operation inside the hatched area 904 as shown in FIG. 9, the levels which define the timing are now given by the equations:

$$A_{ON} = \left(-\frac{1}{4} - \frac{\gamma}{4}\right) \text{mod} 1, \ B_{ON} = \left(1 - \frac{\delta_x}{4}\right) \text{mod} 1 \quad (5)$$

$$A_{OFF} = \left(\frac{1}{4} + \frac{\delta_x}{4}\right) \text{mod} 1, \ B_{OFF} = \left(\frac{1}{2} - \frac{\gamma}{4}\right) \text{mod} 1 \quad (6)$$

Here $X_{ON}$ and $X_{OFF}$ indicate the instants where phase leg X (X∈[A, B], referring to the lettering in FIG. 3) switches from bottom on to top on or vice versa respectively. The "mod 1" notation is used to indicate that all signals <0 and >1 wrap around into the interval [0:1], allowing the comparison with the saw tooth carriers to work. Operation in the white triangular areas 906 shown in FIG. 9 is defined by the following equations:

| Triangle | Switching leg | | Continuous leg | |
| --- | --- | --- | --- | --- |
| upper right | $B_{ON} = \left(\frac{1}{2} + \frac{\gamma}{4}\right) \text{mod } 1, B_{OFF} = \left(\frac{1}{2} - \frac{\gamma}{4}\right) \text{mod } 1$ | | TopA is on | (7) |
| upper left | $A_{ON} = \left(\frac{3}{4} - \frac{\gamma}{4}\right) \text{mod } 1, A_{OFF} = \left(\frac{3}{4} + \frac{\gamma}{4}\right) \text{mod } 1$ | | TopB is on | (8) |
| lower right | $A_{ON} = \left(\frac{3}{4} - \frac{\gamma}{4}\right) \text{mod } 1, A_{OFF} = \left(\frac{3}{4} + \frac{\gamma}{4}\right) \text{mod } 1$ | | BotB is on | (9) |
| lower left | $B_{ON} = \left(\frac{1}{2} + \frac{\gamma}{4}\right) \text{mod } 1, B_{OFF} = \left(\frac{1}{2} - \frac{\gamma}{4}\right) \text{mod } 1$ | | BotA is on | (10) |

For the legs which are continuously in the same state, the "switching instants" and the associated levels have no meaning. Depending on the hardware implementation it can be practical to define these levels such that they also are continuous at the boundaries of the triangular areas 906. One such implementation uses the following values for the non-switching phase legs:

| Triangles | Continuous leg |
|---|---|
| upper right and lower left | $A_{ON} = A_{OFF} = \left(\frac{1}{4} + \frac{\delta_x}{4}\right) \mod 1$ (11) |
| upper left and lower right | $B_{ON} = B_{OFF} = \left(1 - \frac{\delta_x}{4}\right) \mod 1$ (12) |

With these definitions, all timing instants are continuous functions of •* and •*.

The primary task of the complete gradient amplifier is to provide voltage and current to a gradient coil in such a way that a reference (set point) signal is accurately scaled and reproduced in the coil current. This task is in general governed by a control system. In the most common (feedback) incarnation this system compares the actual coil current with the set point value and uses the difference between these two to set the output voltage of the amplifier. In order to obtain a faster response, often a feed-forward path, using a model of the gradient coil behavior, is added. The outputs of both controller parts are then added to obtain a set point for the coil voltage. An example of such a mixed feedback/feedforward controller is shown together with other parts of the gradient chain in FIG. 13.

Figure 13:
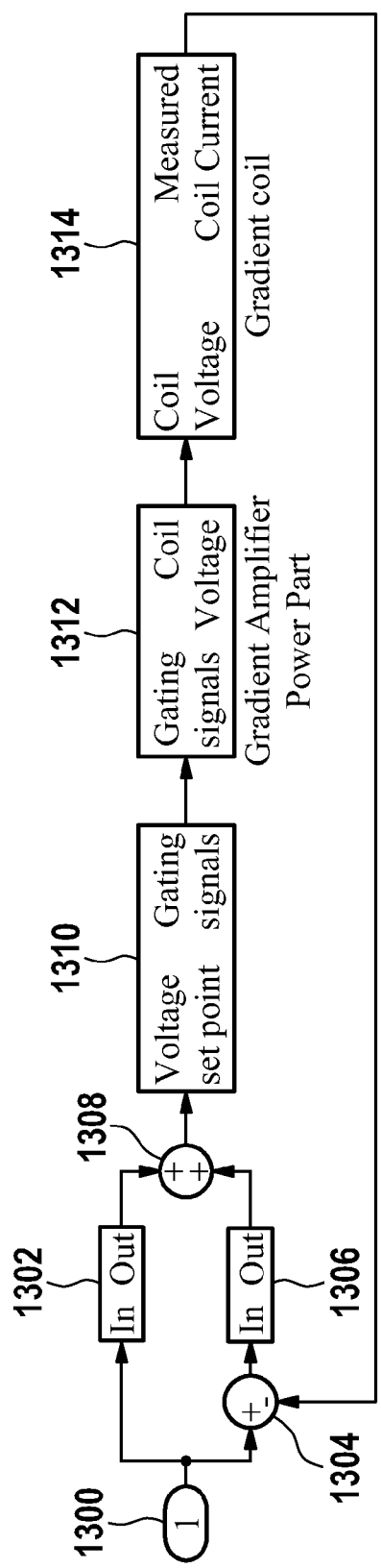
FIG. 13 shows a functional diagram of a control system for controlling the current in the load for an embodiment of a power supply according to the invention.

FIG. 13 is an example of a control system for embodiment of a power supply according to the invention. 1300 is the current set point desired in the gradient coil and magnetic resonance imaging system. It is connected to element 1302 and 1304. 1302 is a feedforward control element, internally using an approximately inverted model of the load or gradient coil behaviour. The output of 1302 is an estimate of the voltage necessary to drive the desired current through the gradient coil. In some embodiments, due to model inaccuracies, the output of 1302 will not be accurate enough and an additional feedback control element is added to obtain the desired performance. To achieve this, element 1304 also receives a signal from the measured coil current of the gradient coil 1314. 1304 determines the difference between the feedback signal from the gradient coil 1314 and the current set point 1300. The difference is used in a feedback control element 1306. 1302 and 1306 both send signals to 1308 which sums the signal from these two and determines a voltage set point. The voltage set point is used by the modulator 1310, the modulator sends gating signals to the gradient amplifier 1312. The gradient amplifier generates a voltage which is used to drive the gradient coil 1314. A sensor in the gradient coil 1314 measures the coil current which is fed back into element 1304. The basic circuit as shown in FIG. 13 is in many cases further enhanced by using various other signals, such as the supply voltage(s), temperature, etc.

For the invention, it is important to recognize that the output of the combined controllers is a measure of the coil voltage. In the notation used before, the controller gives a set point for the average value of signal Sum=(U1+U2+U3). How large the individual contributions by U1, U2 and U3 need to be depends on factors such as:

The desire to avoid the white triangular areas in FIG. 9, so that the ripple frequency can always be doubled;

The desire to control the state of charge of the floating capacitors;

The desire to smoothen the power drawn from the power supply.

Not all these desires can be fulfilled at the same time. They will be discussed in the following.

Obtain Double Ripple Frequency

A given controller output (U1+U2+U3) can be realized by multiple combinations of •* and •*, which in the plane as shown in FIG. 9 show up as diagonal lines with slope −1. This implies that any specific value for •* can always be realized without entering a white area in that figure, i.e. while maintaining a doubled ripple frequency. Avoiding these white areas possibly comes at the price of a temporary suboptimal balance between the powers to draw from the floating and the powered full bridges. However, as the time intervals during which the absolute value of •* is larger than 2 are limited, the adverse effects of the mentioned sub-optimality can be repaired later when the absolute value of •* is lower.

Control of the State of Charge of the Floating Capacitors

For this discussion, we will assume that set point values for the voltages on the floating capacitors are available. As in the current control loop presented above, these set points can be compared to the corresponding actual (measured) voltage and the difference used to correct the voltage. To correct the voltage on a floating capacitor, a current with the correct sign has to be supplied to either charge or discharge it. The magnitude of this current determines how fast the correction is taking place.

Due to the nature of the circuit, providing a charging or discharging current to the floating capacitor is possible only when a current is flowing in the gradient coil, and the magnitude of the charging current is limited by this gradient current in both positive and negative directions. It follows that control of the voltage on the floating capacitor is not possible when the gradient current is exactly zero, and the control system will need to take this into account. If a non-zero current $I_{GRAD}$ is flowing in the chain and a current $I_{CHARGEi}$ is desired to charge the floating capacitor, the duty cycle •$_i$ of a powered full bridge is defined by:

$$\gamma_i = \frac{I_{CHARGEi}}{I_{GRAD}}, \text{ where } \gamma_i \text{ is constrained to the interval } [-1:1]. \quad (13)$$

Figure 14:
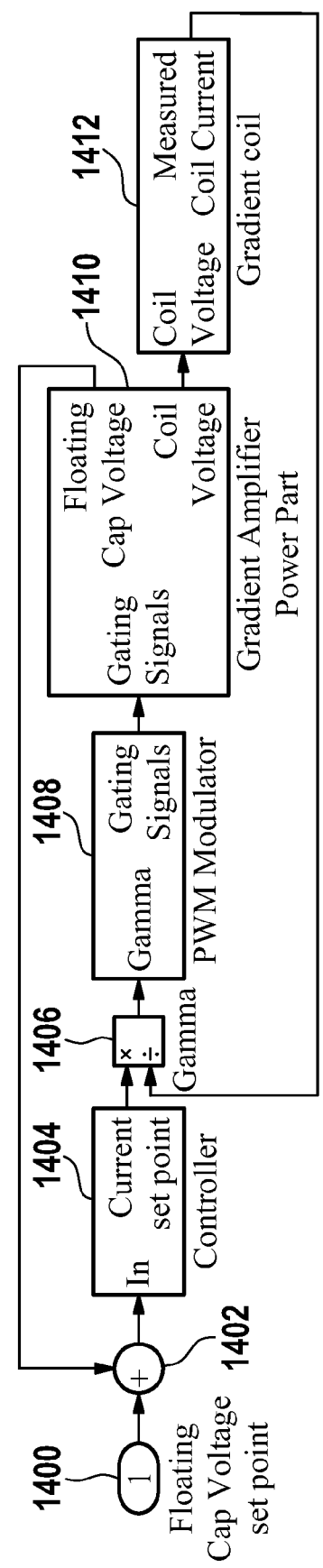
FIG. 14 shows a functional diagram of a control system for regulating the voltage of the capacitor in a floating full bridge circuit for an embodiment of a power supply according to the invention.

FIG. 14 shows an example of a voltage control for a power supply that uses a floating full bridge circuit. This control circuit is controlling the charge of the capacitor in the floating full bridge circuit. 1400 is the floating capacitance voltage set point. 1402 is an element which determines a control error based upon the initial set point and a measurement of the capacitor's voltage made in the gradient amplifier power supply 1410. The control error calculated by element 1402 is sent to a controller 1404 which determines a current set point. Element 1406 calculates a control signal for the duty cycle by dividing the current set point calculated by 1404 through the measured coil current from a gradient coil 1412. The control signal is sent to the modulator 1408 which generates the gated signals which are used to control the gradient amplifier power supply 1410. A measurement of the floating capacitance voltage by 1410 is sent back to element 1402. The voltage generated by 1410 is used to power a gradient coil 1412. The measured coil current is sent back to element 1406 for the calculation of the gamma control signal.

Note that in FIG. 14 only the signals relevant to the voltage control are shown, and the constraint on •$_t$ (drawn as Gamma in the circuit) is not explicitly shown.

Smoothen the supply power and provide continuous power

The energy provided to a gradient coil can be divided into two fractions:

Energy which is dissipated (and lost);
Energy which is stored (and can possibly be recovered).

For the latter part, we will only address energy which is stored in the inductance of the gradient coil, but if a filter is used the energy stored in the filter components can be added as well. Usually, the energy stored in the filter is only a small fraction of the total stored energy, and we will disregard this part in the following discussion to keep the explanation as concise as possible. In any case, the stored part of the energy is limited in size. A convenient method to deal with these two fractions is as follows:

Stored energy is provided by and returned back to the floating capacitors;
Dissipated energy is provided by the power supply.

This way of working implies that the power supply needs to be only unidirectional, and that when energy is returned from the gradient coil to the floating capacitors no overvoltage can ever result. In effect, the set point for the voltage on the floating capacitors can now be derived easily from the condition that the net stored energy is constant:

$$E_{FLOAT} + E_{GRAD} = K \quad (14)$$

$$\Rightarrow \frac{C_{FLOAT} U_{FLOAT}^2}{2} + \frac{L_{GRAD} I_{GRAD}^2}{2}$$

$$= \frac{C_{FLOAT} U_{FLOATMAX}^2}{2}$$

$$\Rightarrow U_{FLOAT}$$

$$= \sqrt{\frac{C_{FLOAT} U_{FLOATMAX}^2 - L_{GRAD} I_{GRAD}^2}{C_{FLOAT}}}$$

$$= \sqrt{U_{FLOATMAX}^2 - \frac{L_{GRAD} I_{GRAD}^2}{C_{FLOAT}}}$$

The meanings of the symbols used in equation (14) are given in the following table.

| Symbol | Meaning | Unit |
| --- | --- | --- |
| $E_{FLOAT}$ | Energy stored in the floating capacitors | [J] |
| $E_{GRAD}$ | Energy stored in gradient coil | [J] |
| K | Net stored energy | [J] |
| $C_{FLOAT}$ | Total capacitance in the powered full bridges | [F] |
| $U_{FLOAT}$ | Voltage across the powered full bridge capacitors | [V] |
| $L_{GRAD}$ | Value of the gradient coil | [H] |
| $I_{GRAD}$ | Current through the gradient coil | [A] |
| $U_{FLOATMAX}$ | Maximum voltage used across the floating capacitors | [V] |

Using the system with the set point for the voltage on the floating capacitors as defined by equation (14) will lead to the situation where the dissipated power is provided by the power supply. For typical gradient current shapes this can lead to substantial ripples in the power to be supplied, and additional filtering, for example using a large shared DC bus capacitor for the powered full bridges of the three gradient axes might be appropriate. As this has no influence on the modulation method, this will not be addressed further.

Simulation Results

In this section, the operation of the modulator is shown using results from a Simulink model which implements the invention. In the first examples (shown in FIG. 16-FIG. 19), one variable (• or •) is varied between its minimum and maximum while the other is kept constant. In the last example (shown in FIG. 20), both • and • are varied.

Figure 15:
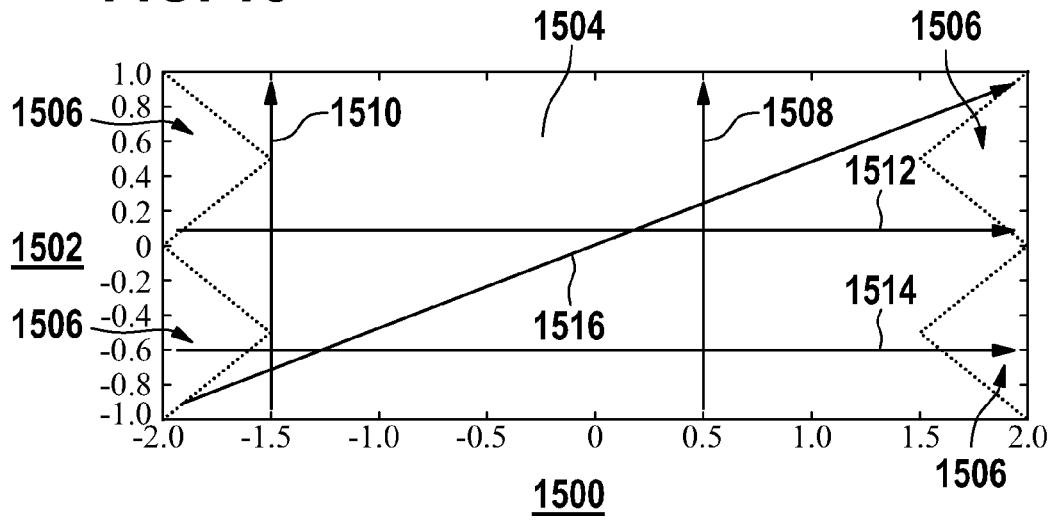
FIG. 15 shows the regions where an embodiment of a power supply according to the invention can be operated such that the ripple frequency can be doubled as a function of • and • with the trajectories of simulations as a function of • and •.

FIG. 15 shows a plot of the same data as in FIG. 9. The axis 1500 represents the duty cycle of two floating full bridge circuits. Axis 1502 represents duty cycle of the powered full bridge circuit. Region 1504 is a region where ripple frequency can be doubled. The regions 1506 represent the region where ripple frequency cannot be doubled. In FIGS. 16 through 20 modulation patterns and the output voltage per power supply are shown when either the duty cycle of the two floating full bridge circuits is held constant and a duty cycle of the powered full bridge circuit 1502 is varied or when the duty cycle of the powered full bridge circuit 1502 is held constant and the duty cycle of the two floating full bridge circuits is varied between its maximum and minimum. Note that in 1516, corresponding to FIG. 20, both variables • and • are changed from their respective minimum to maximum values. FIG. 15 shows graphically how these two variables are varied in the subsequent simulations. Arrow 1508 shows the trajectory in FIG. 16. Arrow 1510 shows the trajectory of the calculation in FIG. 17. Arrow 1512 shows the trajectory in FIG. 18. Arrow 1514 shows the trajectory taken by FIG. 19 and arrow 1516 shows the trajectory taken by FIG. 20.

For all examples to be shown in the sequel, the voltages of the three full bridges are shown together with their sum. For every trace, the intended average value (actually the values for •, •$_1$, •$_2$ and •*) is shown as well. The latter signals can be readily distinguished from the pulsating voltages because for these examples they have a much smoother nature.

Figure 19:
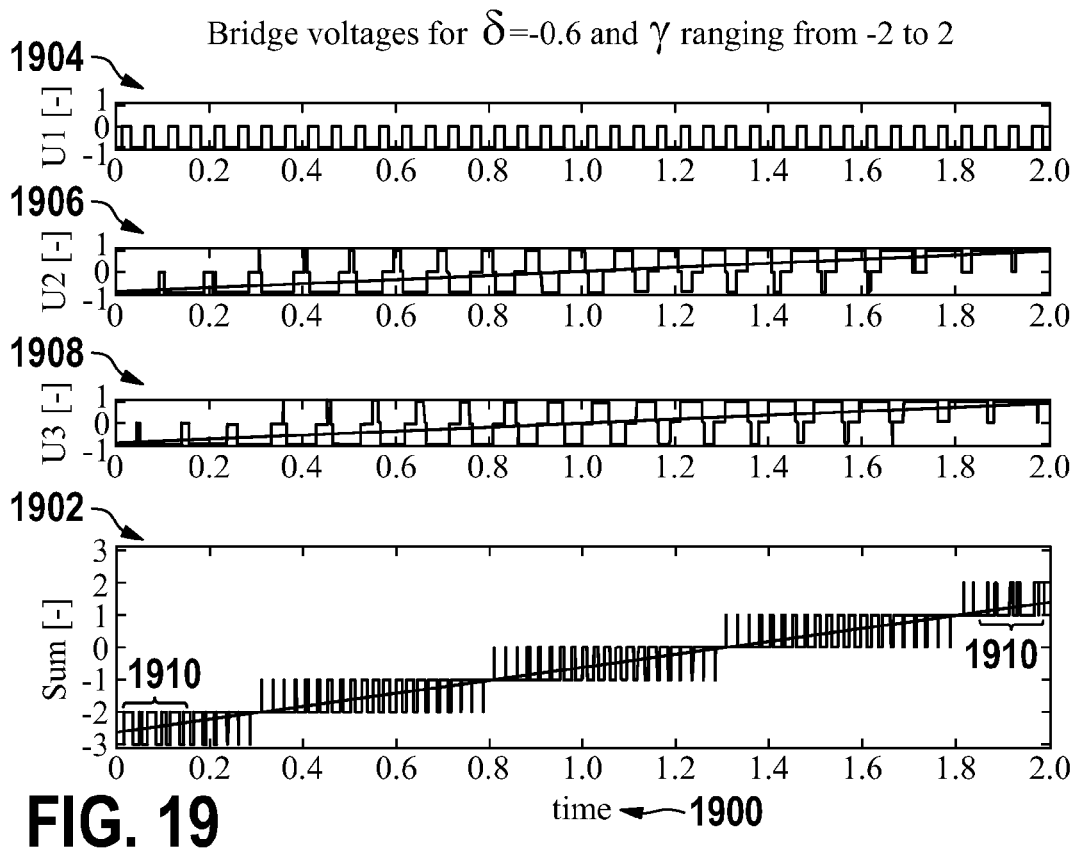
FIG. 19 shows further simulation results for an embodiment of a power supply according to an embodiment of the invention.

As is shown in FIG. 15, all examples presented here, except for the one shown in FIG. 19, stay away from the triangular areas 1506 where the net pulse frequency is not doubled. The lower traces in the following figures (except FIG. 19) indeed show a net pulse frequency of 40 kHz (4/100 μs) in the Sum signal (lower trace) during the whole simulation. The example in FIG. 19 shows some irregularities in the pulse frequency of the Sum signal near the beginning and end of the simulation, where the trajectory described by (•,•) passes through one of said triangular areas.

In FIG. 16 through 20, like numbered elements are chosen such that the least two significant digits are identical. Like numbered elements that have been discussed once will not necessarily be described again. In all examples the timing values as determined by equations (4) through (12) have been used.

Figure 16:
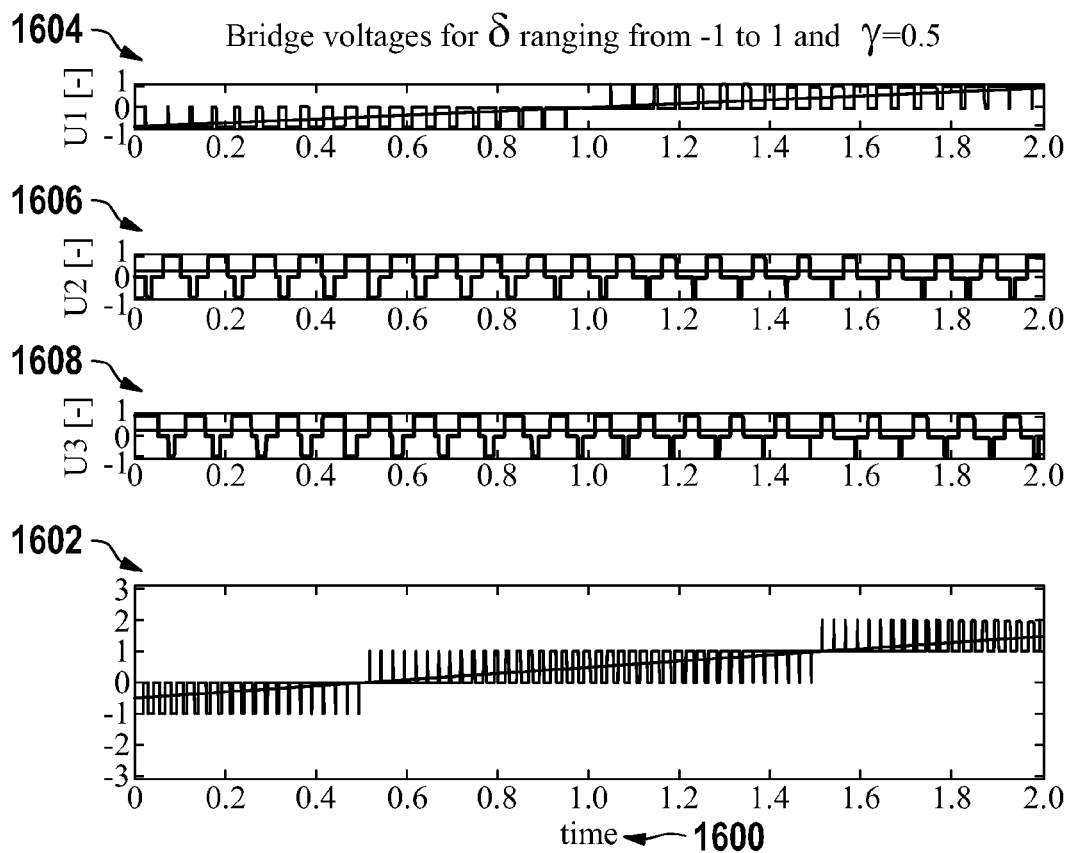
FIG. 16 shows simulation results for an embodiment of a power supply according to an embodiment of the invention.

FIG. 16 shows a simulation where • is kept constant at 0.5, and • is varied from −1 to 1. Note that the two floating full bridges are treated symmetrically, i.e. •$_1$=•$_2$=•/2. 1600 is the time axis, 1602 shows the output of the power supply, 1604 shows the modulation of the voltage across the powered full bridge circuit, 1606 and 1608 show the voltages across the two floating full bridge circuits.

Figure 17:
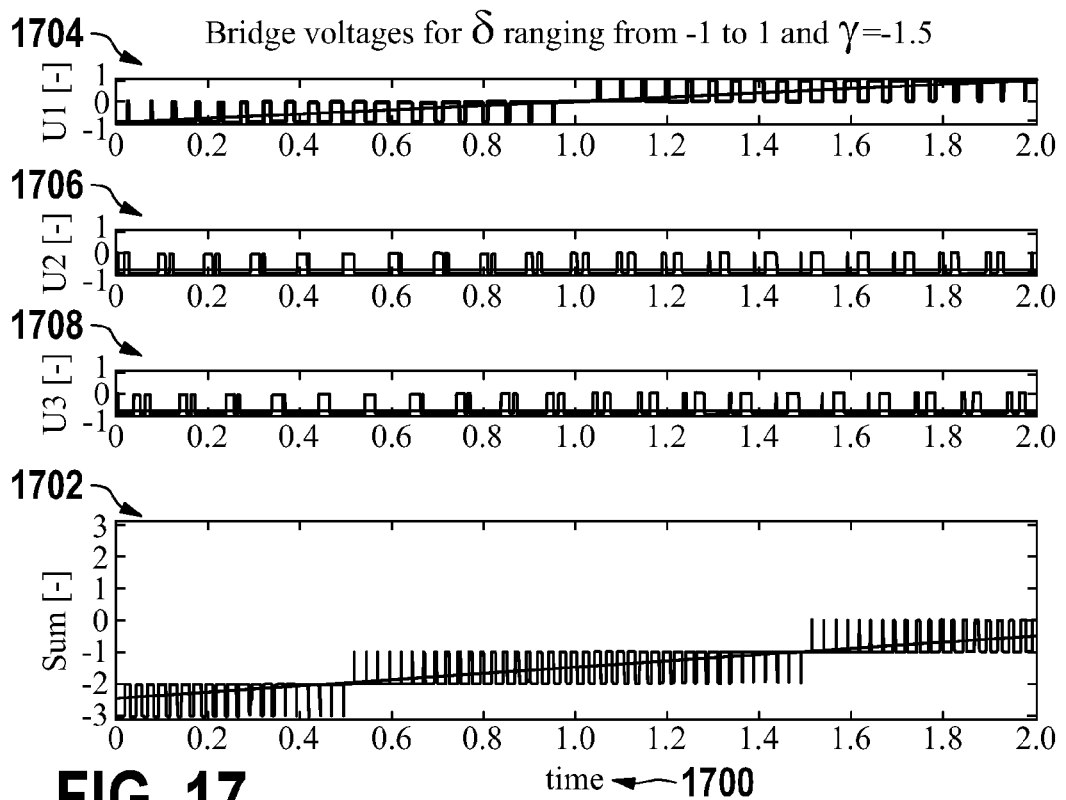
FIG. 17 shows further simulation results for an embodiment of a power supply according to an embodiment of the invention.

FIG. 17 shows a simulation result when • is kept constant at −1.5 and • ranges from −1 to 1.

Figure 18:
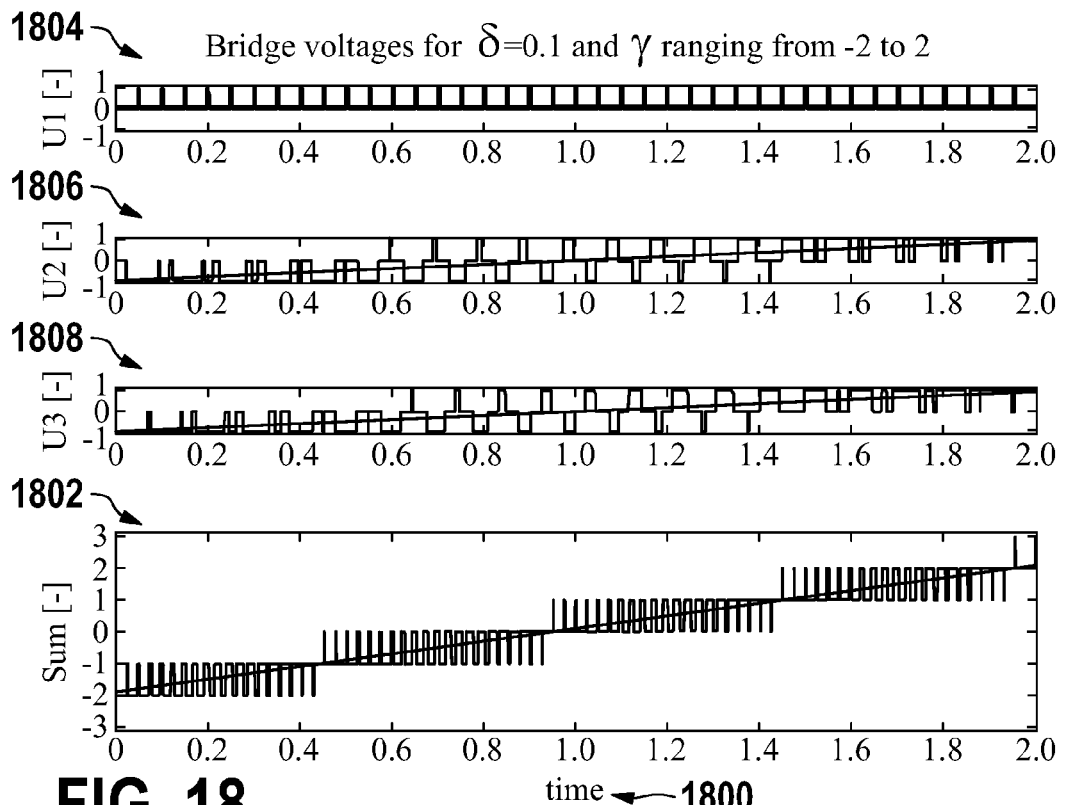
FIG. 18 shows further simulation results for an embodiment of a power supply according to an embodiment of the invention.

FIG. 18 shows a simulation when • is kept constant at 0.1 and • ranges from −2 to 2.

FIG. 19 shows simulation results when • is equal to −0.6 and • ranges from −2 to 2. Note that in the areas marked with brackets 1910 the pulse pattern is less regular than elsewhere. The area indicated by brackets is when the power supply is operating within region 1506 of FIG. 15. The reader may want to compare this trace to its counterpart in FIG. 18.

Figure 20:
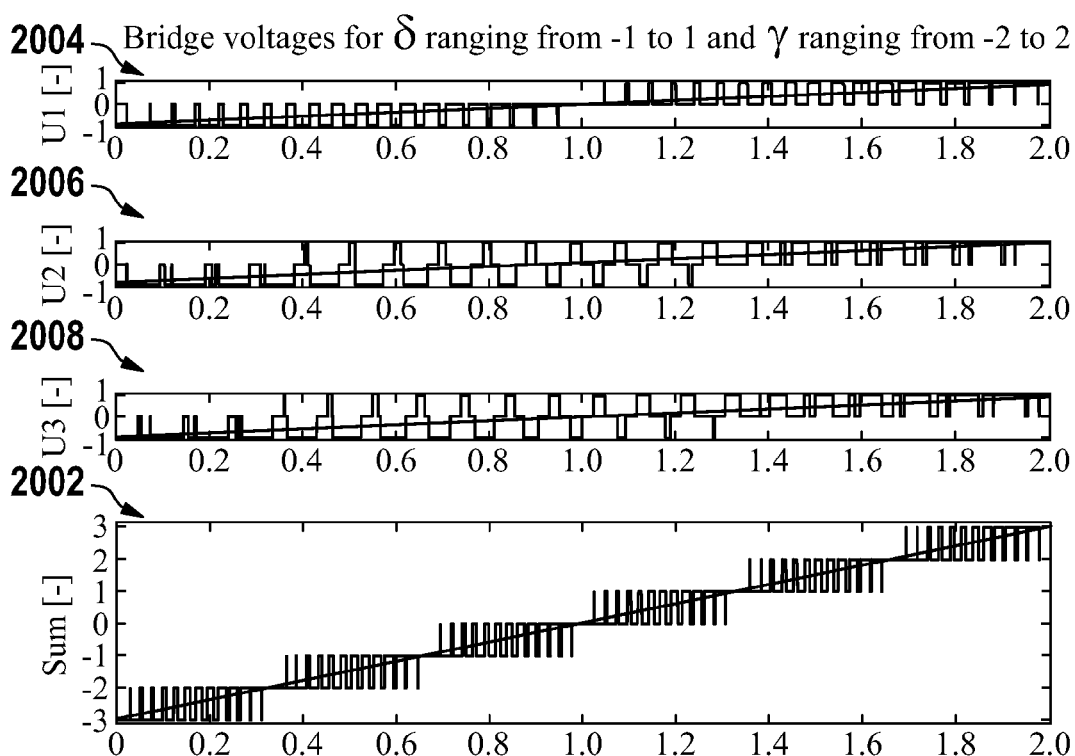
FIG. 20 shows further simulation results for an embodiment of a power supply according to an embodiment of the invention.

FIG. 20 shows simulation results when • ranges from −1 to 1 and • ranges from −2 to 2.

Figure 21:
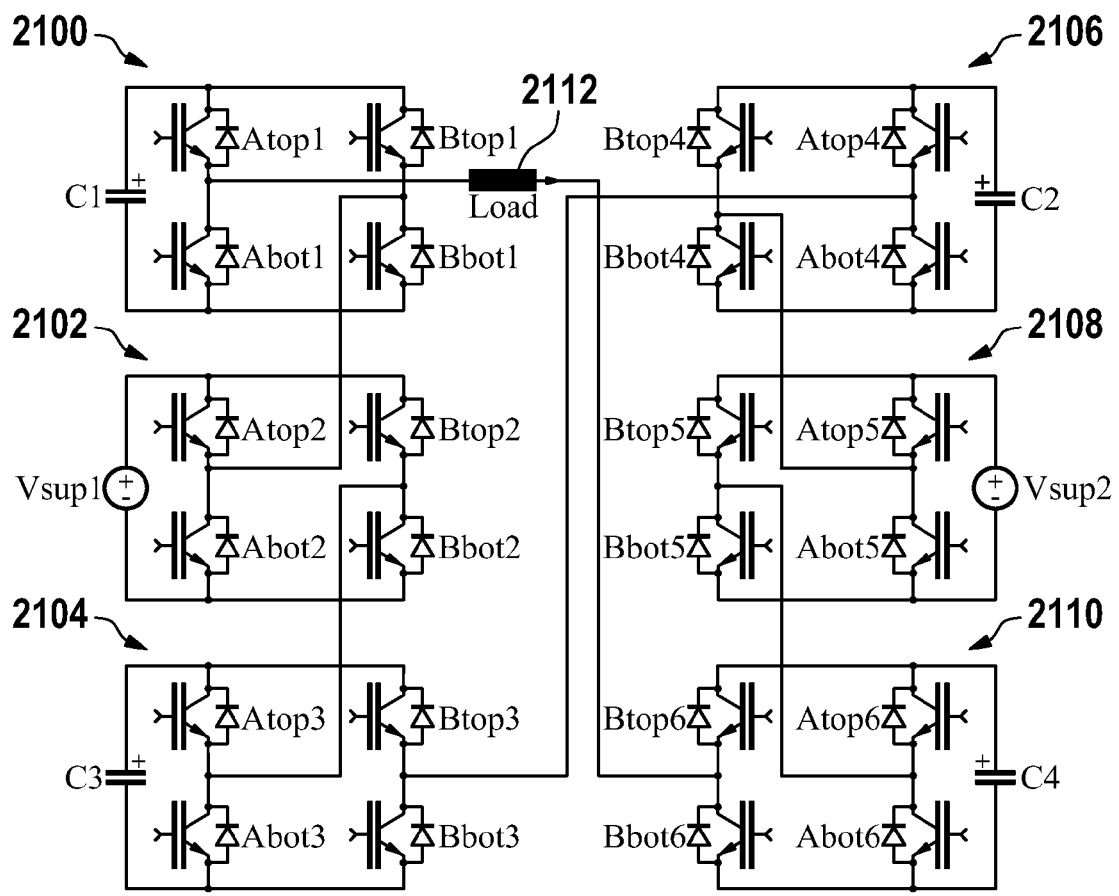
FIG. 21 shows a schematic of a further embodiment of a power supply according to the invention.

FIG. 21 shows an embodiment of a power supply that has two powered full bridge circuits and four floating full bridge circuits. Floating full bridge circuit 2100 is connected to load 2112 and to powered full bridge circuit 2102. Powered full bridge circuit 2102 is also connected to floating full bridge circuit 2104. Floating full bridge circuit 2104 is also connected to floating full bridge circuit 2106. Floating full bridge circuit 2106 is also connected to powered full bridge circuit 2108. Powered full bridge circuit 2108 is also connected to floating full bridge circuit 2110. Floating full bridge circuit 2110 is also connected to the load 2112.

The circuit in FIG. 21 shows a stack composed of six bridges 2100, 2102, 2104, 2106, 2108, 2110 which are connected in series (i.e. node B of bridge N is connected to node A of bridge N+1 systematically), the outermost terminals of 2100 and 2110 are connected to the load 2112. The load 2112 is drawn here as a single inductor but can be more complicated. The two bridges in the middle 2102 and 2108 are supplied with power by direct current power sources Vsup1 and Vsup2 respectively. The other four bridges 2100, 2104, 2106, 2110 are supplied only by means of floating capacitors C1, C2, C3, C4.

The trigger signals for the IGBTs in the left half of the circuit (i.e. Atop1 downto Bbot3) can be triggered with the same signals as derived before for a stack with 3 bridges of which only one is supplied. The remaining IGBTs (i.e. Btop4 downto Abot6) are triggered with essentially the same signals, but now derived using carriers which have been shifted over 1/8 of a full cycle, i.e. over 45 degrees.

Figure 22:
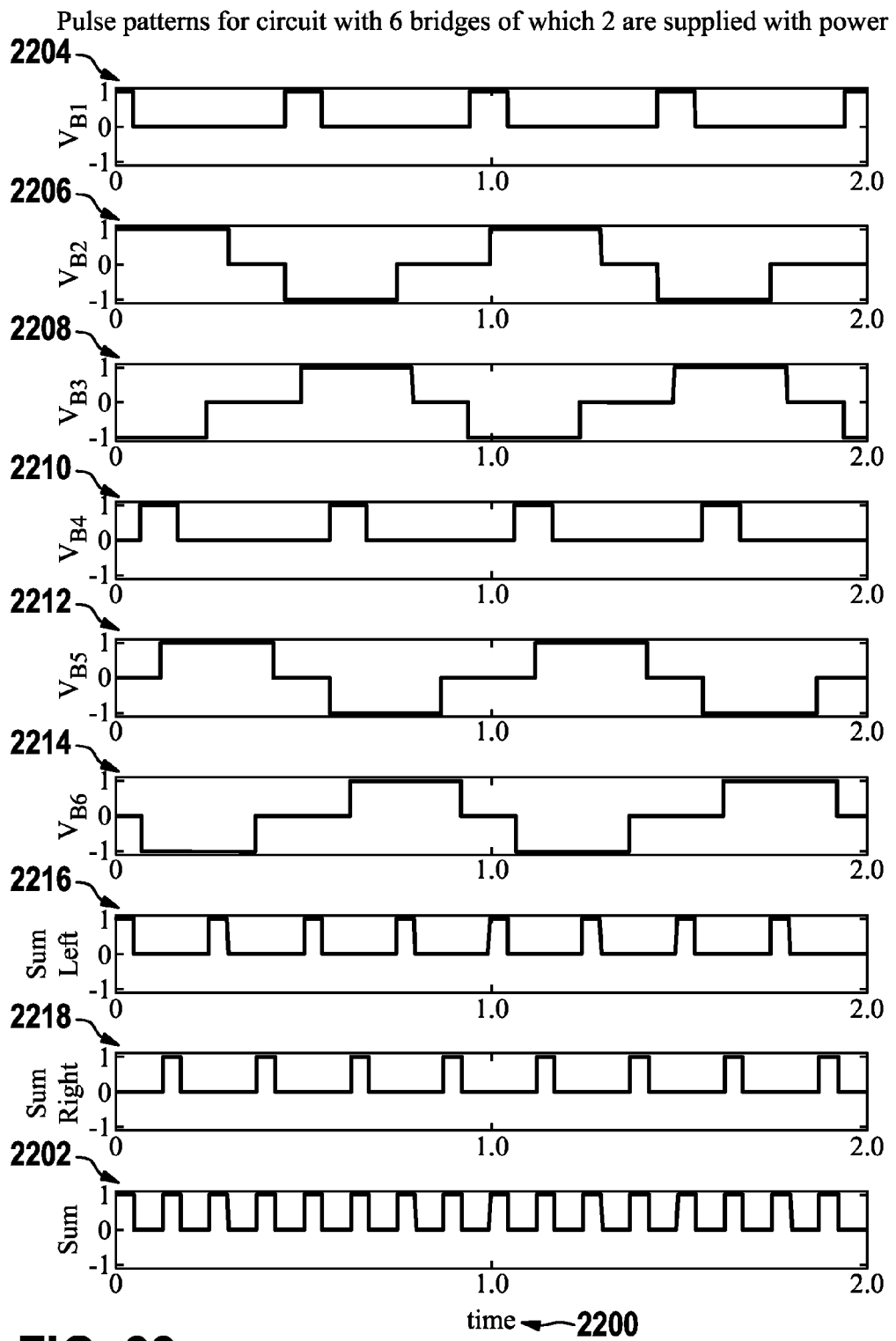
FIG. 22 shows a further illustration of a pulse modulation pattern for operating a power supply according to an embodiment of the invention.

FIG. 22 shows a possible pulse pattern for operating the switching means of the full bridge circuits shown in FIG. 21. The time axis is 2200. 2204 shows the voltage across powered full bridge circuit 2102. 2206 shows a voltage across floating full bridge circuit 2100. 2208 shows the voltage across floating full bridge circuit 2104. 2210 shows the voltage across powered full bridge circuit 2108. 2212 shows the voltage across floating full bridge circuit 2106. 2214 shows the voltage across floating full bridge circuit 2110. 2216 shows the sum of the voltages across floating full bridge circuit 2100, powered full bridge circuit 2102, and floating full bridge circuit 2104. 2218 shows the sum of the voltages across floating full bridge circuit 2106, powered full bridge circuit 2108, and floating full bridge circuit 2110. 2202 shows the voltage across the load which is the sum of 2216 and 2218.

From top to down the traces show the outputs of the 6 individual bridges, followed by the sum of the left and right triples, and in the lower trace to sum as would be applied to the load. The figure shows the interleaved operation of the two stack halves, with the resulting net higher ripple frequency. This method applies to stacks consisting of identical substacks, each having 1 powered and (M−1) floating full bridges as before. Less symmetrical set-ups, for example 2 powered and 3 floating full bridges, can also be handled, but will in general have less regular pulse patterns as the cases shown here.

LIST OF REFERENCE NUMERALS

100 Full bridge circuit
102a First Switching means
102b First Switching means
102c First Switching means
102d First Switching means
104a First output connection
104b First output connection
106 Direct Current power supply
108 Load
110 Floating full bridge circuit
112a Second Switching means
112b Second Switching means
112c Second Switching means
112d Second Switching means
114a Second output connection
114b Second output connection
116 Capacitor
118a Output connection
118b Output connection
120 Passive filter
122a Load connection
122b Load connector
124 Modulator
126 Stack of bridge circuits
300 Powered Full bridge circuit
310 First powered full bridge circuit
312 Second powered full bridge circuit
314 Load
340 Voltage across full bridge circuit
342 Voltage across first powered full bridge circuit
344 Voltage across second powered full bridge circuit
400 Time axis
402 Voltage output of power supply
404 Voltage output of powered full bridge circuit
406 Voltage output of first floating full bridge circuit
408 Voltage output of second floating full bridge circuit
500 Time axis
502 Voltage output of power supply
504 Voltage output of powered full bridge circuit
506 Voltage output of first floating full bridge circuit
508 Voltage output of second floating full bridge circuit
510 Voltage output of third floating full bridge circuit
512 Voltage output of fourth floating full bridge circuit
600 Time axis
602 Voltage output of power supply
604 Voltage output of powered full bridge circuit
606 Voltage output of first floating full bridge circuit
608 Voltage output of second floating full bridge circuit
610 Voltage output of third floating full bridge circuit
700 Time
702 Voltage output of power supply
704 Voltage output of powered full bridge circuit
706 Sum of voltages across the two floating full bridge circuits
708 First aligned falling edge
710 Second aligned falling edge
804 Voltage across first floating full bridge circuit
806 Voltage across first phase leg of floating full bridge circuit of first floating full bridge circuit
810 Voltage across second phase leg of floating full bridge circuit of first floating full bridge circuit
812 Voltage across second floating full bridge circuit
814 Voltage across first phase leg of floating full bridge circuit of second floating full bridge circuit
816 Voltage across second phase leg of floating full bridge circuit of second floating full bridge circuit
900 Duty cycle of two floating full bridge circuits
902 Duty cycle of powered full bridge circuit
904 Region where ripple frequency can be doubled
906 Region where ripple frequency cannot be doubled
1000 Time axis
1002 Output of power supply
1004 Voltage across powered full bridge circuit
1006 Sum of voltages across two floating full bridge circuits 1100 Time axis
1102 Modulation carrier for powered full bridge circuit
1104 Modulation carrier for first floating full bridge circuit
1106 Modulation carrier for second floating full bridge circuit
1200 Duty cycle of powered full bridge circuit
1202 Reduced duty cycle
1300 Current set point
1302 Feedforward control element
1304 Determine difference from set point current and measured current
1306 Feedback control element
1308 Element for calculating voltage set point
1310 Modulator
1312 Gradient amplifier power supply
1314 Gradient coil
1400 Capacitor voltage set point
1402 Summing element to calculated control signal
1404 Controller
1406 Element to calculate pulse width control signal
1408 Modulator
1410 Gradient amplifier power supply
1412 Gradient coil
1500 Duty cycle of two floating full bridge circuits
1502 Duty cycle of powered full bridge circuit
1504 Region where ripple frequency can be doubled
1506 Region where ripple frequency cannot be doubled
1508 Trajectory of modulation pattern used in FIG. 16
1510 Trajectory of modulation pattern used in FIG. 17
1512 Trajectory of modulation pattern used in FIG. 18
1514 Trajectory of modulation pattern used in FIG. 19
1516 Trajectory of modulation pattern used in FIG. 20
1600 Time axis
1602 Voltage output of power supply
1604 Voltage across powered full bridge circuit
1606 Voltage across first floating full bridge circuit
1608 Voltage across second floating full bridge circuit
1700 Time axis
1702 Voltage output of power supply
1704 Voltage across powered full bridge circuit
1706 Voltage across first floating full bridge circuit
1708 Voltage across second floating full bridge circuit
1800 Time axis
1802 Voltage output of power supply
1804 Voltage across powered full bridge circuit
1806 Voltage across first floating full bridge circuit
1808 Voltage across second floating full bridge circuit
1900 Time axis
1902 Voltage output of power supply
1904 Voltage across powered full bridge circuit
1906 Voltage across first floating full bridge circuit
1908 Voltage across second floating full bridge circuit
1910 Bracket
2000 Time axis
2002 Voltage output of power supply
2004 Voltage across powered full bridge circuit
2006 Voltage across first floating full bridge circuit
2008 Voltage across second floating full bridge circuit
2100 First floating full bridge circuit
2102 First powered full bridge circuit
2104 Second floating full bridge circuit
2106 Third floating full bridge circuit
2108 Second powered full bridge circuit
2110 Fourth floating full bridge circuit
2112 Load
2200 Time axis
2202 Voltage cross load
2204 Voltage across first powered full bridge circuit
2206 Voltage across first floating full bridge circuit
2208 Voltage across second floating full bridge circuit
2210 Voltage across second powered full bridge circuit
2212 Voltage across third floating full bridge circuit
2214 Voltage across fourth floating full bridge circuit
2216 Voltage across first and second floating full bridge circuits and across first powered full bridge circuit
2218 Voltage across third and fourth floating full bridge circuits and across second powered full bridge circuit

The invention claimed is:

1. A power supply adapted for supplying electrical power to a load, the power supply comprising:
at least one powered full bridge circuit, wherein the powered full bridge circuit is adapted for being powered by a direct current voltage supply, wherein the full bridge circuit comprises a first output connection, wherein the full bridge circuit comprises a first switch that controls the application of electrical power to the first output connection,
at least one floating full bridge circuit, wherein each floating full bridge circuit comprises a capacitor storing a charge, wherein the capacitor supplies the charge to power the floating full bridge circuit, wherein each floating full bridge circuit comprises a second output connection, wherein each floating full bridge circuit comprises a second switch that controls the application of electrical power to the second output connection,
a stack of bridge circuits comprising the at least one powered full bridge circuit and the at least one floating full bridge circuit, wherein the second output connection and first output connection are connected in series, wherein the stack has a third output connection,
a passive filter for averaging the voltage across the third output connection, wherein the passive filter is connected to the third output connection,
a load connector adapted for connecting the passive filter to the load,
a modulator adapted for modulating the first switch and the second switch such that the charge of the capacitor is controlled while electrical power is being supplied to or extracted from the load.

2. The power supply of claim 1, wherein the power supply comprises two or more powered full bridge circuits.

3. The power supply of claim 1, wherein the power supply further comprises a sensor to measure the current through the load, and wherein the modulator is further adapted for controlling the current to the load using the current measurement by adjusting the modulation of the first switch and the second switch.

4. The power supply of claim 1, wherein the modulator is adapted for modulating the first switch and the second switch at the same average frequency.

5. The power supply of claim 1, wherein the modulator is adapted for modulating the first switch and the second switch such that the ripple frequency of the voltage applied to the load is constant and higher than the average switching frequency of said first and second switching means.

6. The power supply of claim 1, wherein the passive filter comprises the load.

7. The power supply of claim 1, wherein the power supply further comprises at least one of the following: a second sensor to measure the current through the filter circuit and a voltage measuring device to measure the voltage in the filter circuit.

8. The power supply of claim 1, wherein the modulator is adapted for modulating the first switch and the second switch in cycles, and wherein the modulator is adapted for modulating the first switch and the second switch in any one of the following ways: at least two rising edges per cycle of the voltage across the first output connection and the voltage across the stack are aligned, at least two falling edges per cycle of the voltage across the first output connection and the voltage across the stack are aligned, and at least one rising edge and at least one falling edge of the voltage across the first output connection and the voltage across the stack are aligned.

9. The power supply of claim 1, wherein the load has an inductance, wherein the modulator is adapted for modulating the first switch and the second switch such that the capacitor is charged or discharged using electrical energy stored in the load.

10. The power supply of claim 1, wherein the modulator is adapted such that the electrical power supplied to the load is a function of time, wherein the modulator is adapted for modulating the first switch at a first rate, and wherein the ripple frequency of the voltage measured across the load is higher than the first rate.

11. The power supply of claim 1, wherein the modulator is adapted for modulating the first switch and the second switch such that the power supply is able to supply power to the load continuously.

12. The power supply of claim 1, wherein the load is a magnetic resonance imaging gradient coil.

13. A method for controlling a power supply adapted for supplying electrical power to a load), wherein the power supply comprises at least one powered full bridge circuit, wherein the powered full bridge circuit is adapted for being powered by a direct current voltage supply, wherein the full bridge circuit comprises a first output connection, wherein the full bridge circuit comprises a first switch that controls the application of electrical power to the first output connection, wherein the power supply further comprises at least one floating full bridge circuit, wherein each floating full bridge circuit comprises a capacitor storing a charge, wherein the capacitor supplies the charge to power the floating full bridge circuit, wherein each floating full bridge circuit comprises a second output connection, wherein each floating full bridge circuit comprises a second switch that controls the application of electrical power to the second output connection, wherein the power supply further comprises a stack of bridge circuits comprising the at least one powered full bridge circuit and the at least one floating full bridge circuit, wherein the second output connection and first output connection are connected in series, wherein the stack has a third output connection, wherein the power supply further comprises a passive filter for averaging the voltage across the third output connection, wherein the passive filter is connected to the third output connection, wherein the power supply further comprises a load connector adapted for connecting the passive filter to the load, wherein the power supply further comprises a modulator adapted for modulating the first switch and the second switch, wherein the method comprises:
  modulating the first switch and the second switch such that the first switch and the second switch operate at the same average frequency,
  adjusting the modulation of the first switch and the second switch such that the charge of the capacitor is controlled while electrical power is being supplied to the load,
  adjusting the modulation of the first switch and the second switch such that the ripple frequency of the voltage applied to the load is constant and is higher than the switching frequency of said first and second switches.

14. A computer program product embodied on a non-transitory computer-readable medium comprising a set of machine executable instructions for execution on a modulator for performing the method of claim 13.

* * * * *